United States Patent
Li

(10) Patent No.: US 11,487,465 B2
(45) Date of Patent: Nov. 1, 2022

(54) METHOD AND SYSTEM FOR A LOCAL STORAGE ENGINE COLLABORATING WITH A SOLID STATE DRIVE CONTROLLER

(71) Applicant: Alibaba Group Holding Limited, Grand Cayman (KY)

(72) Inventor: Shu Li, Bothell, WA (US)

(73) Assignee: Alibaba Group Holding Limited, George Town (KY)

( * ) Notice: Subject to any disclaimer, the term of this patent is extended or adjusted under 35 U.S.C. 154(b) by 0 days.

(21) Appl. No.: 17/119,649

(22) Filed: Dec. 11, 2020

(65) Prior Publication Data

US 2022/0188010 A1    Jun. 16, 2022

(51) Int. Cl.
*G06F 3/06* (2006.01)
*H03M 13/29* (2006.01)
*G11B 20/12* (2006.01)

(52) U.S. Cl.
CPC .......... *G06F 3/0655* (2013.01); *G06F 3/0604* (2013.01); *G06F 3/067* (2013.01);
(Continued)

(58) Field of Classification Search
CPC ...... G06F 3/0655; G06F 3/067; G06F 3/0631; G06F 3/0604; G06F 3/0619;
(Continued)

(56) References Cited

U.S. PATENT DOCUMENTS 3,893,071 A    7/1975 Bossen
4,562,494 A    12/1985 Bond
(Continued)

FOREIGN PATENT DOCUMENTS

WO    9418634    8/1994
WO    1994018634    8/1994

OTHER PUBLICATIONS https://web.archive.org/web/20071130235034/http://en.wikipedia.org:80/wiki/logical_block_addressing wikipedia screen shot retriefed on wayback Nov. 20, 2007 showing both physical and logical addressing used historically to access data on storage devices (Year: 2007).

(Continued)

*Primary Examiner* — Mark A Giardino, Jr.
(74) *Attorney, Agent, or Firm* — Yao Legal Services, Inc.; Shun Yao

(57) ABSTRACT

One embodiment provides a system which facilitates data movement. The system allocates, in a volatile memory of a first storage drive, a first region to be accessed directly by a second storage drive or a first NIC. The first storage drive, the second storage drive, and the first NIC are associated with a first server. The system stores data in the first region. Responsive to receiving a first request from the second storage drive to read the data, the system transmits, by the first storage drive to the second storage drive, the data stored in the first region while bypassing a system memory of the first server. Responsive to receiving, from a third storage drive associated with a second server, a second request to read the data, the system retrieves, by the first NIC, the data stored in the first region while bypassing the system memory of the first server.

16 Claims, 11 Drawing Sheets

(52) U.S. Cl.
CPC .......... *G06F 3/0619* (2013.01); *G06F 3/0631* (2013.01); *H03M 13/2927* (2013.01); *G11B 20/1201* (2013.01); *G11B 20/1217* (2013.01); *G11B 2020/1222* (2013.01)

(58) Field of Classification Search
CPC ........... H03M 13/2927; G11B 20/1201; G11B 20/1217; G11B 20/1222
See application file for complete search history.

(56) References Cited

U.S. PATENT DOCUMENTS

| | | |
|---|---|---|
| 4,718,067 A | 1/1988 | Peters |
| 4,775,932 A | 10/1988 | Oxley |
| 4,858,040 A | 8/1989 | Hazebrouck |
| 5,394,382 A | 2/1995 | Hu |
| 5,602,693 A | 2/1997 | Brunnett |
| 5,715,471 A | 2/1998 | Otsuka |
| 5,732,093 A | 3/1998 | Huang |
| 5,802,551 A | 9/1998 | Komatsu |
| 5,930,167 A | 7/1999 | Lee |
| 6,098,185 A | 8/2000 | Wilson |
| 6,148,377 A | 11/2000 | Carter |
| 6,226,650 B1 | 5/2001 | Mahajan et al. |
| 6,243,795 B1 | 6/2001 | Yang |
| 6,457,104 B1 | 9/2002 | Tremaine |
| 6,658,478 B1 | 12/2003 | Singhal |
| 6,795,894 B1 | 9/2004 | Neufeld |
| 7,351,072 B2 | 4/2008 | Muff |
| 7,565,454 B2 | 7/2009 | Zuberi |
| 7,599,139 B1 | 10/2009 | Bombet |
| 7,953,899 B1 | 5/2011 | Hooper |
| 7,958,433 B1 | 6/2011 | Yoon |
| 8,085,569 B2 | 12/2011 | Kim |
| 8,144,512 B2 | 3/2012 | Huang |
| 8,166,233 B2 | 4/2012 | Schibilla |
| 8,260,924 B2 | 9/2012 | Koretz |
| 8,281,061 B2 | 10/2012 | Radke |
| 8,452,819 B1 | 5/2013 | Sorenson, III |
| 8,516,284 B2 | 8/2013 | Chan |
| 8,527,544 B1 | 9/2013 | Colgrove |
| 8,751,763 B1 | 6/2014 | Ramarao |
| 8,819,367 B1 | 8/2014 | Fallone |
| 8,825,937 B2 | 9/2014 | Atkisson |
| 8,832,688 B2 | 9/2014 | Tang |
| 8,868,825 B1 | 10/2014 | Hayes |
| 8,904,061 B1 | 12/2014 | O'Brien, III |
| 8,949,208 B1 | 2/2015 | Xu |
| 9,015,561 B1 | 4/2015 | Hu |
| 9,031,296 B2 | 5/2015 | Kaempfer |
| 9,043,545 B2 | 5/2015 | Kimmel |
| 9,088,300 B1 | 7/2015 | Chen |
| 9,092,223 B1 | 7/2015 | Pani |
| 9,129,628 B1 | 9/2015 | Fallone |
| 9,141,176 B1 | 9/2015 | Chen |
| 9,208,817 B1 | 12/2015 | Li |
| 9,213,627 B2 | 12/2015 | Van Acht |
| 9,213,632 B1 | 12/2015 | Song |
| 9,280,472 B1 | 3/2016 | Dang |
| 9,280,487 B2 | 3/2016 | Candelaria |
| 9,311,939 B1 | 4/2016 | Malina |
| 9,336,340 B1 | 5/2016 | Dong |
| 9,436,595 B1 | 9/2016 | Benitez |
| 9,495,263 B2 | 11/2016 | Pang |
| 9,529,601 B1 | 12/2016 | Dharmadhikari |
| 9,529,670 B2 | 12/2016 | O'Connor |
| 9,569,454 B2 | 2/2017 | Ebsen |
| 9,575,982 B1 | 2/2017 | Sankara Subramanian |
| 9,588,698 B1 | 3/2017 | Karamcheti |
| 9,588,977 B1 | 3/2017 | Wang |
| 9,607,631 B2 | 3/2017 | Rausch |
| 9,671,971 B2 | 6/2017 | Trika |
| 9,747,202 B1 | 8/2017 | Shaharabany |
| 9,836,232 B1 | 12/2017 | Vasquez |
| 9,852,076 B1 | 12/2017 | Garg |
| 9,875,053 B2 | 1/2018 | Frid |
| 9,910,705 B1 | 3/2018 | Mak |
| 9,912,530 B2 | 3/2018 | Singatwaria |
| 9,923,562 B1 | 3/2018 | Vinson |
| 9,946,596 B2 | 4/2018 | Hashimoto |
| 10,013,169 B2 | 7/2018 | Fisher |
| 10,199,066 B2 | 2/2019 | Feldman |
| 10,229,735 B1 | 3/2019 | Natarajan |
| 10,235,198 B2 | 3/2019 | Qiu |
| 10,268,390 B2 | 4/2019 | Warfield |
| 10,318,467 B2 | 6/2019 | Barzik |
| 10,361,722 B2 | 7/2019 | Lee |
| 10,437,670 B1 | 10/2019 | Koltsidas |
| 10,459,663 B2 | 10/2019 | Agombar |
| 10,642,522 B2 | 5/2020 | Li |
| 10,649,657 B2 | 5/2020 | Zaidman |
| 10,678,432 B1 | 6/2020 | Dreier |
| 10,756,816 B1 | 8/2020 | Dreier |
| 10,928,847 B2 | 2/2021 | Suresh |
| 10,990,526 B1 | 4/2021 | Lam |
| 11,023,150 B2 | 6/2021 | Pletka |
| 11,068,165 B2 | 7/2021 | Sharon |
| 11,138,124 B2 | 10/2021 | Tomic |
| 2001/0032324 A1 | 10/2001 | Slaughter |
| 2001/0046295 A1 | 11/2001 | Sako |
| 2002/0010783 A1 | 1/2002 | Primak |
| 2002/0039260 A1 | 4/2002 | Kilmer |
| 2002/0073358 A1 | 6/2002 | Atkinson |
| 2002/0095403 A1 | 7/2002 | Chandrasekaran |
| 2002/0112085 A1 | 8/2002 | Berg |
| 2002/0161890 A1 | 10/2002 | Chen |
| 2003/0074319 A1 | 4/2003 | Jaquette |
| 2003/0145274 A1 | 7/2003 | Hwang |
| 2003/0163594 A1 | 8/2003 | Aasheim |
| 2003/0163633 A1 | 8/2003 | Aasheim |
| 2003/0217080 A1 | 11/2003 | White |
| 2004/0010545 A1 | 1/2004 | Pandya |
| 2004/0066741 A1 | 4/2004 | Dinker |
| 2004/0103238 A1 | 5/2004 | Avraham |
| 2004/0143718 A1 | 7/2004 | Chen |
| 2004/0255171 A1 | 12/2004 | Zimmer |
| 2004/0267752 A1 | 12/2004 | Wong |
| 2004/0268278 A1 | 12/2004 | Hoberman |
| 2005/0038954 A1 | 2/2005 | Saliba |
| 2005/0097126 A1 | 5/2005 | Cabrera |
| 2005/0138325 A1 | 6/2005 | Hofstee |
| 2005/0144358 A1 | 6/2005 | Conley |
| 2005/0149827 A1 | 7/2005 | Lambert |
| 2005/0174670 A1 | 8/2005 | Dunn |
| 2005/0177672 A1 | 8/2005 | Rao |
| 2005/0177755 A1 | 8/2005 | Fung |
| 2005/0195635 A1 | 9/2005 | Conley |
| 2005/0235067 A1 | 10/2005 | Creta |
| 2005/0235171 A1 | 10/2005 | Igari |
| 2006/0031709 A1 | 2/2006 | Hiraiwa |
| 2006/0101197 A1 | 5/2006 | Georgis |
| 2006/0156009 A1 | 7/2006 | Shin |
| 2006/0156012 A1 | 7/2006 | Beeson |
| 2006/0184813 A1 | 8/2006 | Bui |
| 2007/0033323 A1 | 2/2007 | Gorobets |
| 2007/0061502 A1 | 3/2007 | Lasser |
| 2007/0101096 A1 | 5/2007 | Gorobets |
| 2007/0204128 A1 | 8/2007 | Lee |
| 2007/0250756 A1 | 10/2007 | Gower |
| 2007/0266011 A1 | 11/2007 | Rohrs |
| 2007/0283081 A1 | 12/2007 | Lasser |
| 2007/0283104 A1 | 12/2007 | Wellwood |
| 2007/0285980 A1 | 12/2007 | Shimizu |
| 2008/0028223 A1 | 1/2008 | Rhoads |
| 2008/0034154 A1 | 2/2008 | Lee |
| 2008/0065805 A1 | 3/2008 | Wu |
| 2008/0082731 A1 | 4/2008 | Karamcheti |
| 2008/0104369 A1 | 5/2008 | Reed |
| 2008/0112238 A1 | 5/2008 | Kim |
| 2008/0163033 A1 | 7/2008 | Yim |
| 2008/0195829 A1 | 8/2008 | Wilsey |
| 2008/0301532 A1 | 12/2008 | Uchikawa |
| 2009/0006667 A1 | 1/2009 | Lin |
| 2009/0089544 A1 | 4/2009 | Liu |

(56) References Cited

U.S. PATENT DOCUMENTS

| | | |
|---|---|---|
| 2009/0110078 A1 | 4/2009 | Crinon |
| 2009/0113219 A1 | 4/2009 | Aharonov |
| 2009/0125788 A1 | 5/2009 | Wheeler |
| 2009/0177944 A1 | 7/2009 | Kanno |
| 2009/0183052 A1 | 7/2009 | Kanno |
| 2009/0254705 A1 | 10/2009 | Abali |
| 2009/0282275 A1 | 11/2009 | Yermalayeu |
| 2009/0287956 A1 | 11/2009 | Flynn |
| 2009/0307249 A1 | 12/2009 | Koifman |
| 2009/0307426 A1 | 12/2009 | Galloway |
| 2009/0310412 A1 | 12/2009 | Jang |
| 2010/0031000 A1 | 2/2010 | Flynn |
| 2010/0169470 A1 | 7/2010 | Takashige |
| 2010/0217952 A1 | 8/2010 | Iyer |
| 2010/0229224 A1 | 9/2010 | Etchegoyen |
| 2010/0241848 A1 | 9/2010 | Smith |
| 2010/0281254 A1 | 11/2010 | Carro |
| 2010/0321999 A1 | 12/2010 | Yoo |
| 2010/0325367 A1 | 12/2010 | Kornegay |
| 2010/0332922 A1 | 12/2010 | Chang |
| 2011/0031546 A1 | 2/2011 | Uenaka |
| 2011/0055458 A1 | 3/2011 | Kuehne |
| 2011/0055471 A1 | 3/2011 | Thatcher |
| 2011/0060722 A1 | 3/2011 | Li |
| 2011/0072204 A1 | 3/2011 | Chang |
| 2011/0099418 A1 | 4/2011 | Chen |
| 2011/0153903 A1 | 6/2011 | Hinkle |
| 2011/0161621 A1 | 6/2011 | Sinclair |
| 2011/0161784 A1 | 6/2011 | Selinger |
| 2011/0191525 A1 | 8/2011 | Hsu |
| 2011/0218969 A1 | 9/2011 | Anglin |
| 2011/0231598 A1 | 9/2011 | Hatsuda |
| 2011/0239083 A1 | 9/2011 | Kanno |
| 2011/0252188 A1 | 10/2011 | Weingarten |
| 2011/0258514 A1 | 10/2011 | Lasser |
| 2011/0289263 A1 | 11/2011 | Mcwilliams |
| 2011/0289280 A1 | 11/2011 | Koseki |
| 2011/0292538 A1 | 12/2011 | Haga |
| 2011/0296411 A1 | 12/2011 | Tang |
| 2011/0299317 A1 | 12/2011 | Shaeffer |
| 2011/0302353 A1 | 12/2011 | Confalonieri |
| 2011/0302408 A1 | 12/2011 | Mcdermott |
| 2012/0017037 A1 | 1/2012 | Riddle |
| 2012/0039117 A1 | 2/2012 | Webb |
| 2012/0084523 A1 | 4/2012 | Littlefield |
| 2012/0089774 A1 | 4/2012 | Kelkar |
| 2012/0096330 A1 | 4/2012 | Przybylski |
| 2012/0117399 A1 | 5/2012 | Chan |
| 2012/0147021 A1 | 6/2012 | Cheng |
| 2012/0151253 A1 | 6/2012 | Horn |
| 2012/0159099 A1 | 6/2012 | Lindamood |
| 2012/0159289 A1 | 6/2012 | Piccirillo |
| 2012/0173792 A1 | 7/2012 | Lassa |
| 2012/0203958 A1 | 8/2012 | Jones |
| 2012/0210095 A1 | 8/2012 | Nellans |
| 2012/0233523 A1 | 9/2012 | Krishnamoorthy |
| 2012/0246392 A1 | 9/2012 | Cheon |
| 2012/0278579 A1 | 11/2012 | Goss |
| 2012/0284587 A1 | 11/2012 | Yu |
| 2012/0324312 A1 | 12/2012 | Moyer |
| 2012/0331207 A1 | 12/2012 | Lassa |
| 2013/0013880 A1 | 1/2013 | Tashiro |
| 2013/0013887 A1 | 1/2013 | Sugahara |
| 2013/0016970 A1 | 1/2013 | Koka |
| 2013/0018852 A1 | 1/2013 | Barton |
| 2013/0024605 A1 | 1/2013 | Sharon |
| 2013/0054822 A1 | 2/2013 | Mordani |
| 2013/0061029 A1 | 3/2013 | Huff |
| 2013/0073798 A1 | 3/2013 | Kang |
| 2013/0080391 A1 | 3/2013 | Raichstein |
| 2013/0138871 A1 | 5/2013 | Chiu |
| 2013/0145085 A1 | 6/2013 | Yu |
| 2013/0145089 A1 | 6/2013 | Eleftheriou |
| 2013/0151759 A1 | 6/2013 | Shim |
| 2013/0159251 A1 | 6/2013 | Skrenta |
| 2013/0159723 A1 | 6/2013 | Brandt |
| 2013/0166820 A1 | 6/2013 | Batwara |
| 2013/0173845 A1 | 7/2013 | Aslam |
| 2013/0179898 A1 | 7/2013 | Fang |
| 2013/0191601 A1 | 7/2013 | Peterson |
| 2013/0205183 A1 | 8/2013 | Fillingim |
| 2013/0219131 A1 | 8/2013 | Alexandron |
| 2013/0227347 A1 | 8/2013 | Cho |
| 2013/0238955 A1 | 9/2013 | D Abreu |
| 2013/0254622 A1 | 9/2013 | Kanno |
| 2013/0318283 A1 | 11/2013 | Small |
| 2013/0318395 A1 | 11/2013 | Kalavade |
| 2013/0329492 A1 | 12/2013 | Yang |
| 2014/0006688 A1 | 1/2014 | Yu |
| 2014/0019650 A1 | 1/2014 | Li |
| 2014/0025638 A1 | 1/2014 | Hu |
| 2014/0082273 A1 | 3/2014 | Segev |
| 2014/0082412 A1 | 3/2014 | Matsumura |
| 2014/0095758 A1* | 4/2014 | Smith ............... G06F 3/0685 710/308 |
| 2014/0095769 A1 | 4/2014 | Borkenhagen |
| 2014/0095827 A1 | 4/2014 | Wei |
| 2014/0108414 A1 | 4/2014 | Stillerman |
| 2014/0108891 A1 | 4/2014 | Strasser |
| 2014/0164447 A1 | 6/2014 | Tarafdar |
| 2014/0164879 A1 | 6/2014 | Tam |
| 2014/0181532 A1 | 6/2014 | Camp |
| 2014/0195564 A1 | 7/2014 | Talagala |
| 2014/0215129 A1 | 7/2014 | Kuzmin |
| 2014/0223079 A1 | 8/2014 | Zhang |
| 2014/0233950 A1 | 8/2014 | Luo |
| 2014/0250259 A1 | 9/2014 | Ke |
| 2014/0279927 A1 | 9/2014 | Constantinescu |
| 2014/0304452 A1 | 10/2014 | De La Iglesia |
| 2014/0310574 A1 | 10/2014 | Yu |
| 2014/0337457 A1* | 11/2014 | Nowoczynski ..... G06F 16/1847 709/212 |
| 2014/0359229 A1 | 12/2014 | Cota-Robles |
| 2014/0365707 A1 | 12/2014 | Talagala |
| 2014/0379965 A1 | 12/2014 | Gole |
| 2015/0006792 A1 | 1/2015 | Lee |
| 2015/0019798 A1 | 1/2015 | Huang |
| 2015/0039849 A1 | 2/2015 | Lewis |
| 2015/0067436 A1 | 3/2015 | Hu |
| 2015/0082317 A1 | 3/2015 | You |
| 2015/0106556 A1 | 4/2015 | Yu |
| 2015/0106559 A1 | 4/2015 | Cho |
| 2015/0121031 A1 | 4/2015 | Feng |
| 2015/0142752 A1 | 5/2015 | Chennamsetty |
| 2015/0143030 A1 | 5/2015 | Gorobets |
| 2015/0186657 A1 | 7/2015 | Nakhjiri |
| 2015/0199234 A1 | 7/2015 | Choi |
| 2015/0227316 A1 | 8/2015 | Warfield |
| 2015/0234845 A1 | 8/2015 | Moore |
| 2015/0269964 A1 | 9/2015 | Fallone |
| 2015/0277937 A1 | 10/2015 | Swanson |
| 2015/0286477 A1 | 10/2015 | Mathur |
| 2015/0294684 A1 | 10/2015 | Qjang |
| 2015/0301964 A1 | 10/2015 | Brinicombe |
| 2015/0304108 A1 | 10/2015 | Obukhov |
| 2015/0310916 A1 | 10/2015 | Leem |
| 2015/0317095 A1 | 11/2015 | Voigt |
| 2015/0341123 A1 | 11/2015 | Nagarajan |
| 2015/0347025 A1 | 12/2015 | Law |
| 2015/0363271 A1 | 12/2015 | Haustein |
| 2015/0363328 A1 | 12/2015 | Candelaria |
| 2015/0372597 A1 | 12/2015 | Luo |
| 2016/0014039 A1 | 1/2016 | Reddy |
| 2016/0026575 A1 | 1/2016 | Samanta |
| 2016/0041760 A1 | 2/2016 | Kuang |
| 2016/0048327 A1 | 2/2016 | Jayasena |
| 2016/0048341 A1 | 2/2016 | Constantinescu |
| 2016/0054922 A1 | 2/2016 | Awasthi |
| 2016/0062885 A1 | 3/2016 | Ryu |
| 2016/0077749 A1 | 3/2016 | Ravimohan |
| 2016/0077764 A1 | 3/2016 | Ori |
| 2016/0077968 A1 | 3/2016 | Sela |
| 2016/0078245 A1 | 3/2016 | Amarendran |
| 2016/0098344 A1 | 4/2016 | Gorobets |

(56) References Cited

U.S. PATENT DOCUMENTS

| | | |
|---|---|---|
| 2016/0098350 A1 | 4/2016 | Tang |
| 2016/0103631 A1 | 4/2016 | Ke |
| 2016/0110254 A1 | 4/2016 | Cronie |
| 2016/0124742 A1 | 5/2016 | Rangasamy |
| 2016/0132237 A1 | 5/2016 | Jeong |
| 2016/0141047 A1 | 5/2016 | Sehgal |
| 2016/0154601 A1 | 6/2016 | Chen |
| 2016/0155750 A1 | 6/2016 | Yasuda |
| 2016/0162187 A1 | 6/2016 | Lee |
| 2016/0179399 A1 | 6/2016 | Melik-Martirosian |
| 2016/0188223 A1 | 6/2016 | Camp |
| 2016/0188890 A1 | 6/2016 | Naeimi |
| 2016/0203000 A1 | 7/2016 | Parmar |
| 2016/0224267 A1 | 8/2016 | Yang |
| 2016/0232103 A1 | 8/2016 | Schmisseur |
| 2016/0234297 A1 | 8/2016 | Ambach |
| 2016/0239074 A1 | 8/2016 | Lee |
| 2016/0239380 A1 | 8/2016 | Wideman |
| 2016/0274636 A1 | 9/2016 | Kim |
| 2016/0283140 A1 | 9/2016 | Kaushik |
| 2016/0306699 A1 | 10/2016 | Resch |
| 2016/0306853 A1 | 10/2016 | Sabaa |
| 2016/0321002 A1 | 11/2016 | Jung |
| 2016/0335085 A1 | 11/2016 | Scalabrino |
| 2016/0342345 A1 | 11/2016 | Kankani |
| 2016/0343429 A1 | 11/2016 | Nieuwejaar |
| 2016/0350002 A1 | 12/2016 | Vergis |
| 2016/0350385 A1 | 12/2016 | Poder |
| 2016/0364146 A1 | 12/2016 | Kuttner |
| 2016/0381442 A1 | 12/2016 | Heanue |
| 2017/0004037 A1 | 1/2017 | Park |
| 2017/0010652 A1 | 1/2017 | Huang |
| 2017/0068639 A1* | 3/2017 | Davis .................. H04L 49/3009 |
| 2017/0075583 A1 | 3/2017 | Alexander |
| 2017/0075594 A1 | 3/2017 | Badam |
| 2017/0091110 A1 | 3/2017 | Ash |
| 2017/0109199 A1 | 4/2017 | Chen |
| 2017/0109232 A1 | 4/2017 | Cha |
| 2017/0123655 A1 | 5/2017 | Sinclair |
| 2017/0147499 A1 | 5/2017 | Mohan |
| 2017/0161202 A1 | 6/2017 | Erez |
| 2017/0162235 A1 | 6/2017 | De |
| 2017/0168986 A1 | 6/2017 | Sajeepa |
| 2017/0177217 A1 | 6/2017 | Kanno |
| 2017/0177259 A1 | 6/2017 | Motwani |
| 2017/0185316 A1 | 6/2017 | Nieuwejaar |
| 2017/0185498 A1 | 6/2017 | Gao |
| 2017/0192848 A1 | 7/2017 | Pamies-Juarez |
| 2017/0199823 A1 | 7/2017 | Hayes |
| 2017/0212680 A1* | 7/2017 | Waghulde ............. G06F 16/185 |
| 2017/0212708 A1 | 7/2017 | Suhas |
| 2017/0220254 A1 | 8/2017 | Warfield |
| 2017/0221519 A1 | 8/2017 | Matsuo |
| 2017/0228157 A1 | 8/2017 | Yang |
| 2017/0242722 A1 | 8/2017 | Qiu |
| 2017/0249162 A1 | 8/2017 | Tsirkin |
| 2017/0262176 A1 | 9/2017 | Kanno |
| 2017/0262178 A1 | 9/2017 | Hashimoto |
| 2017/0262217 A1 | 9/2017 | Pradhan |
| 2017/0269998 A1 | 9/2017 | Sunwoo |
| 2017/0277655 A1* | 9/2017 | Das ....................... G06F 12/023 |
| 2017/0279460 A1 | 9/2017 | Camp |
| 2017/0285976 A1 | 10/2017 | Durham |
| 2017/0286311 A1 | 10/2017 | Juenemann |
| 2017/0322888 A1 | 11/2017 | Booth |
| 2017/0344470 A1 | 11/2017 | Yang |
| 2017/0344491 A1 | 11/2017 | Pandurangan |
| 2017/0353576 A1 | 12/2017 | Guim Bernat |
| 2018/0024772 A1 | 1/2018 | Madraswala |
| 2018/0024779 A1 | 1/2018 | Kojima |
| 2018/0033491 A1 | 2/2018 | Marelli |
| 2018/0052797 A1 | 2/2018 | Barzik |
| 2018/0067847 A1 | 3/2018 | Oh |
| 2018/0069658 A1 | 3/2018 | Benisty |
| 2018/0074730 A1 | 3/2018 | Inoue |
| 2018/0076828 A1 | 3/2018 | Kanno |
| 2018/0088867 A1 | 3/2018 | Kaminaga |
| 2018/0107591 A1 | 4/2018 | Smith |
| 2018/0113631 A1 | 4/2018 | Zhang |
| 2018/0143780 A1 | 5/2018 | Cho |
| 2018/0150640 A1 | 5/2018 | Li |
| 2018/0165038 A1 | 6/2018 | Authement |
| 2018/0165169 A1 | 6/2018 | Camp |
| 2018/0165340 A1 | 6/2018 | Agarwal |
| 2018/0167268 A1 | 6/2018 | Liguori |
| 2018/0173620 A1 | 6/2018 | Cen |
| 2018/0188970 A1 | 7/2018 | Liu |
| 2018/0189175 A1 | 7/2018 | Ji |
| 2018/0189182 A1 | 7/2018 | Wang |
| 2018/0212951 A1 | 7/2018 | Goodrum |
| 2018/0219561 A1 | 8/2018 | Litsyn |
| 2018/0226124 A1 | 8/2018 | Perner |
| 2018/0232151 A1 | 8/2018 | Badam |
| 2018/0260148 A1 | 9/2018 | Klein |
| 2018/0270110 A1 | 9/2018 | Chugtu |
| 2018/0293014 A1 | 10/2018 | Ravimohan |
| 2018/0300203 A1 | 10/2018 | Kathpal |
| 2018/0321864 A1 | 11/2018 | Benisty |
| 2018/0322024 A1 | 11/2018 | Nagao |
| 2018/0329776 A1 | 11/2018 | Lai |
| 2018/0336921 A1 | 11/2018 | Ryun |
| 2018/0349396 A1 | 12/2018 | Blagojevic |
| 2018/0356992 A1 | 12/2018 | Lamberts |
| 2018/0357126 A1 | 12/2018 | Dhuse |
| 2018/0373428 A1 | 12/2018 | Kan |
| 2018/0373655 A1 | 12/2018 | Liu |
| 2018/0373664 A1 | 12/2018 | Vijayrao |
| 2019/0012111 A1 | 1/2019 | Li |
| 2019/0034454 A1 | 1/2019 | Gangumalla |
| 2019/0050312 A1 | 2/2019 | Li |
| 2019/0050327 A1 | 2/2019 | Li |
| 2019/0065085 A1 | 2/2019 | Jean |
| 2019/0073261 A1 | 3/2019 | Halbert |
| 2019/0073262 A1 | 3/2019 | Chen |
| 2019/0087089 A1 | 3/2019 | Yoshida |
| 2019/0087115 A1 | 3/2019 | Li |
| 2019/0087328 A1 | 3/2019 | Kanno |
| 2019/0108145 A1 | 4/2019 | Raghava |
| 2019/0116127 A1 | 4/2019 | Pismenny |
| 2019/0166725 A1 | 5/2019 | Jing |
| 2019/0171532 A1 | 6/2019 | Abadi |
| 2019/0172820 A1 | 6/2019 | Meyers |
| 2019/0196748 A1 | 6/2019 | Badam |
| 2019/0196907 A1 | 6/2019 | Khan |
| 2019/0205206 A1 | 7/2019 | Hornung |
| 2019/0212949 A1 | 7/2019 | Pletka |
| 2019/0220392 A1 | 7/2019 | Lin |
| 2019/0227927 A1 | 7/2019 | Miao |
| 2019/0272242 A1 | 9/2019 | Kachare |
| 2019/0278654 A1 | 9/2019 | Kaynak |
| 2019/0317901 A1 | 10/2019 | Kachare |
| 2019/0320020 A1 | 10/2019 | Lee |
| 2019/0339998 A1 | 11/2019 | Momchilov |
| 2019/0361611 A1 | 11/2019 | Hosogi |
| 2019/0377632 A1 | 12/2019 | Oh |
| 2019/0377821 A1 | 12/2019 | Pleshachkov |
| 2019/0391748 A1 | 12/2019 | Li |
| 2020/0004456 A1 | 1/2020 | Williams |
| 2020/0004674 A1 | 1/2020 | Williams |
| 2020/0013458 A1 | 1/2020 | Schreck |
| 2020/0042223 A1 | 2/2020 | Li |
| 2020/0042387 A1 | 2/2020 | Shani |
| 2020/0082006 A1 | 3/2020 | Rupp |
| 2020/0084918 A1 | 3/2020 | Shen |
| 2020/0089430 A1 | 3/2020 | Kanno |
| 2020/0092209 A1 | 3/2020 | Chen |
| 2020/0097189 A1 | 3/2020 | Tao |
| 2020/0133841 A1 | 4/2020 | Davis |
| 2020/0143885 A1 | 5/2020 | Kim |
| 2020/0159425 A1 | 5/2020 | Flynn |
| 2020/0167091 A1 | 5/2020 | Haridas |
| 2020/0210309 A1 | 7/2020 | Jung |
| 2020/0218449 A1 | 7/2020 | Leitao |
| 2020/0225875 A1 | 7/2020 | Oh |

(56) References Cited

U.S. PATENT DOCUMENTS

| | | | |
|---|---|---|---|
| 2020/0242021 | A1 | 7/2020 | Gholamipour |
| 2020/0250032 | A1 | 8/2020 | Goyal |
| 2020/0257598 | A1 | 8/2020 | Yazovitsky |
| 2020/0322287 | A1 | 10/2020 | Connor |
| 2020/0326855 | A1 | 10/2020 | Wu |
| 2020/0328192 | A1 | 10/2020 | Zaman |
| 2020/0348888 | A1 | 11/2020 | Kim |
| 2020/0364094 | A1* | 11/2020 | Kahle ............... G06F 9/5083 |
| 2020/0371955 | A1* | 11/2020 | Goodacre .......... G06F 12/0811 |
| 2020/0387327 | A1 | 12/2020 | Hsieh |
| 2020/0401334 | A1 | 12/2020 | Saxena |
| 2020/0409559 | A1 | 12/2020 | Sharon |
| 2020/0409791 | A1 | 12/2020 | Devriendt |
| 2021/0010338 | A1 | 1/2021 | Santos |
| 2021/0075633 | A1 | 3/2021 | Sen |
| 2021/0089392 | A1 | 3/2021 | Shirakawa |
| 2021/0103388 | A1 | 4/2021 | Choi |
| 2021/0124488 | A1 | 4/2021 | Stoica |
| 2021/0132999 | A1* | 5/2021 | Haywood .......... G06F 12/1009 |
| 2021/0191635 | A1 | 6/2021 | Hu |
| 2021/0286555 | A1 | 9/2021 | Li |

OTHER PUBLICATIONS

Ivan Picoli, Carla Pasco, Bjorn Jonsson, Luc Bouganim, Philippe Bonnet. "uFLIP-OC: Understanding Flash I/O Patterns on Open-Channel Solid-State Drives." APSys'17, Sep. 2017, Mumbai, India, pp. 1-7, 2017, <10.1145/3124680.3124741>. <hal-01654985>.

EMC Powerpath Load Balancing and Failover Comparison with native MPIO operating system solutions. Feb. 2011.

Tsuchiya, Yoshihiro et al. "DBLK: Deduplication for Primary Block Storage", MSST 2011, Denver, CO, May 23-27, 2011 pp. 1-5.

Chen Feng, et al. "CAFTL: A Content-Aware Flash Translation Layer Enhancing the Lifespan of Flash Memory based Solid State Devices"< FAST'11, San Jose, CA Feb. 15-17, 2011, pp. 1-14.

Wu, Huijun et al. "HPDedup: A Hybrid Prioritized Data Deduplication Mechanism for Primary Storage in the Cloud", Cornell Univ. arXiv: 1702.08153v2[cs.DC], Apr. 16, 2017, pp. 1-14https://www.syncids.com/#.

WOW: Wise Ordering for Writes—Combining Spatial and Temporal Locality in Non-Volatile Caches by Gill (Year: 2005).

Helen H. W. Chan et al. "HashKV: Enabling Efficient Updated in KV Storage via Hashing", https://www.usenix.org/conference/atc18/presentation/chan, (Year: 2018).

S. Hong and D. Shin, "NAND Flash-Based Disk Cache Using SLC/MLC Combined Flash Memory," 2010 International Workshop on Storage Network Architecture and Parallel I/Os, Incline Village, NV, 2010, pp. 21-30.

Arpaci-Dusseau et al. "Operating Systems: Three Easy Pieces", Originally published 2015; Pertinent: Chapter 44; flash-based SSDs, available at http://pages.cs.wisc.edu/~remzi/OSTEP/.

Jimenex, X., Novo, D. and P. Ienne, "Pheonix:Reviving MLC Blocks as SLC to Extend NAND Flash Devices Lifetime,"Design, Automation & Text in Europe Conference & Exhibition (Date), 2013.

Yang, T. Wu, H. and W. Sun, "GD-FTL: Improving the Performance and Lifetime of TLC SSD by Downgrading Worn-out Blocks," IEEE 37th International Performance Computing and Communications Conference (IPCCC), 2018.

C. Wu, D. Wu, H. Chou and C. Cheng, "Rethink the Design of Flash Translation Layers in a Component-Based View", in IEEE Acess, vol. 5, pp. 12895-12912, 2017.

Po-Liang Wu, Yuan-Hao Chang and T. Kuo, "A file-system-aware FTL design for flash-memory storage systems," 2009, pp. 393-398.

S. Choudhuri and T. Givargis, "Preformance improvement of block based NAND flash translation layer", 2007 5th IEEE/ACM/IFIP International Conference on Hardware/Software Codesign and Systems Synthesis (CODES+ISSS). Saizburg, 2007, pp. 257-262.

A. Zuck, O. Kishon and S. Toledo. "LSDM: Improving the Preformance of Mobile Storage with a Log-Structured Address Remapping Device Driver", 2014 Eighth International Conference on Next Generation Mobile Apps, Services and Technologies, Oxford, 2014, pp. 221-228.

J. Jung and Y. Won, "nvramdisk: A Transactional Block Device Driver for Non-Volatile RAM", in IEEE Transactions on Computers, vol. 65, No. 2, pp. 589-600, Feb. 1, 2016.

Te I et al. (Pensieve: a Machine Assisted SSD Layer for Extending the Lifetime: (Year: 2018).

ARM ("Cortex-R5 and Cortex-R5F", Technical reference Manual, Revision r1p1) (Year:2011).

* cited by examiner

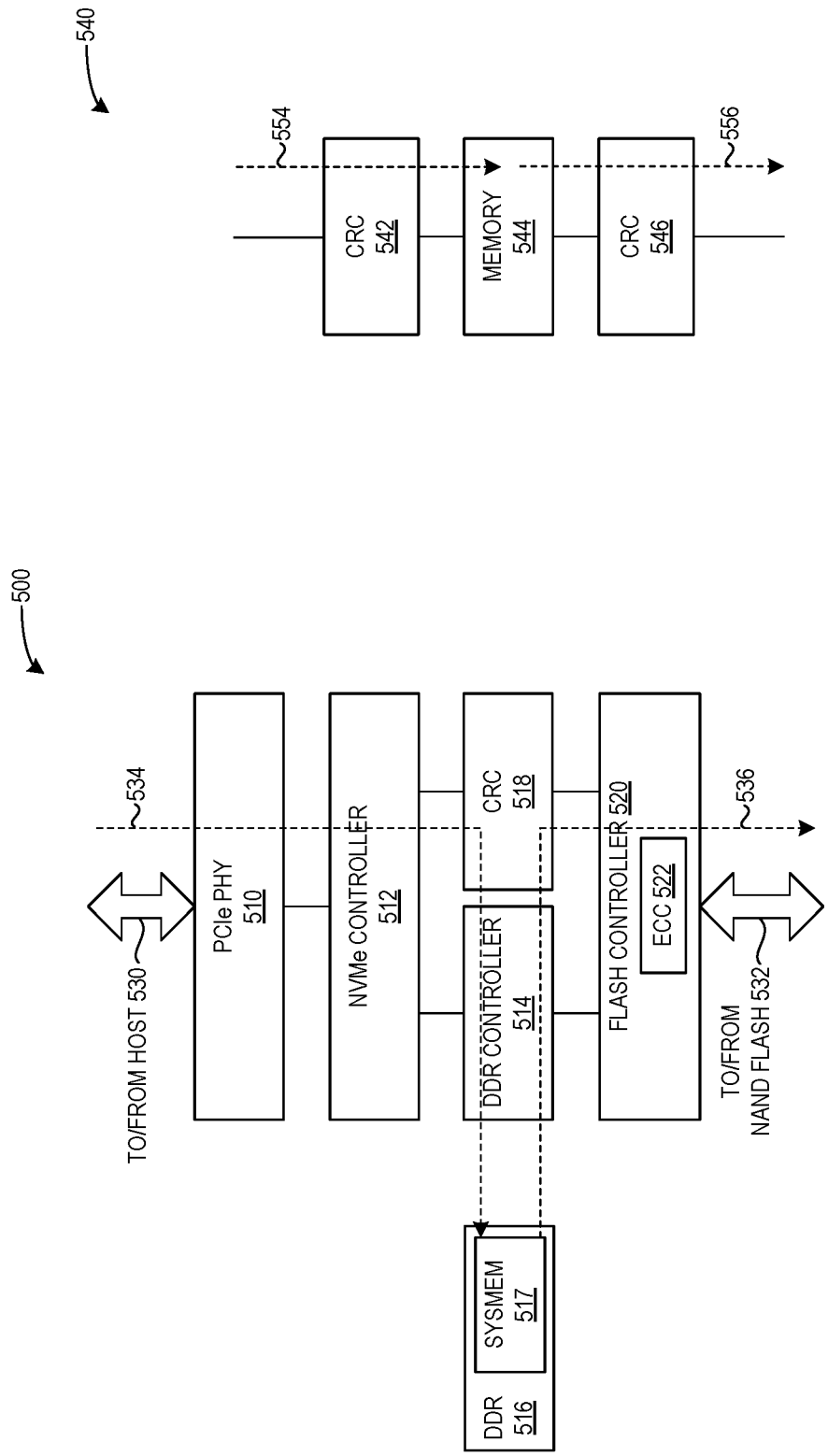

METHOD AND SYSTEM FOR A LOCAL STORAGE ENGINE COLLABORATING WITH A SOLID STATE DRIVE CONTROLLER

BACKGROUND

Field

This disclosure is generally related to the field of data storage. More specifically, this disclosure is related to a method and system for a local storage engine collaborating with a solid state drive (SSD) controller.

Related Art

Today, various storage systems are being used to store and access the ever-increasing amount of digital content. A storage system can include storage servers with one or more storage devices or drives (such as a solid-state drive (SSD)). In the architecture of an existing storage system, a central processing unit (CPU) complex can include a CPU and system memory, which can serve as the data hub. Data transfers both within a storage server (e.g., between storage drives of the same storage server) and between storage servers (e.g., between storages drive of different storage servers) can result in multiple folds of memory copy which involve the CPU and system memory. These data transfers can result in an increased latency, an increased consumption of memory bandwidth, and an increased utilization of the CPU complex or core. In scenarios which involve a large amount of data transfer, the system performance and resource consumption can suffer and limit the efficiency of the overall storage system.

SUMMARY

One embodiment provides a system which facilitates data movement while bypassing the system memory. During operation, the system allocates, in a volatile memory of a first storage drive, a first region to be accessed directly by a second storage drive. The system stores data in the first region of the first storage drive. Responsive to receiving a first request from the second storage drive to read the data, the system transmits, by the first storage drive to the second storage drive, the data stored in the first region while bypassing a system memory of a first server.

In some embodiments, the first storage drive and the second storage drive are associated with the first server.

In some embodiments, the first region of the first storage drive is to be further accessed by a third storage drive via a first network interface card (NIC). The first NIC is associated with the first server, and the third storage drive is associated with a second server In some embodiments, responsive to receiving, from the third storage drive, a second request to read the data, the system retrieves, by the first NIC, the data stored in the first region while bypassing the system memory of the first server. The system stores, by the first NIC, the data as formatted data which includes formatting information and a payload. The system sends, by the first NIC to a second NIC associated with the second server, the formatted data. The system stores, by the second NIC, the formatted data. The system sends, by the second NIC to a local storage engine associated with the second server, metadata associated with the data. The system generates, by the local storage engine, management information which includes a physical block address of a non-volatile memory of the third storage drive to which the data is to be written. The system sends, by the local storage engine, the management information to the third storage drive. The system sends, by the second NIC, the payload to the third storage drive. The system receives, by the third storage drive, the management information from the local storage engine and the payload from the second NIC. The system writes, by the third storage drive, the data to the non-volatile memory of the third storage drive based on the received management information.

In some embodiments, the formatting information includes one or more of a frame header, an Internet Protocol (IP) header, and a Transmission Control Protocol (TCP) header. The payload includes one or more of application data and user data. Sending, by the first NIC to the second NIC, the formatted data further involves sending the formatted data through an Ethernet switch.

In some embodiments, the system sets, in the second NIC, a second region of a volatile memory of the second NIC as a host memory which is directly accessible by the third storage drive. The system stores, by the second NIC, the formatted data in the second region of the second NIC.

In some embodiments, subsequent to sending, by the second NIC to the local storage engine, the metadata, the system performs the following operations. The system generates, by a network engine of the local storage engine, the management information, which includes one or more of an order and a merged size. The system groups, by a chunk organization module of the local storage engine, multiple chunks of data in parallel. The system allocates, by a local file system of the local storage engine, a logical extent or a range of logical block addresses (LBAs) based on metadata associated with the multiple chunks. The system sends, by the file system to a flash translation layer module of the local storage engine, the allocated LBAs. The system receives, by the flash translation layer module, the allocated LBAs. The system generates, by the flash translation layer module, physical block addresses (PBAs) mapped to the allocated LBAs. The system transmits, by the flash translation layer module to a Non-Volatile Memory Express (NVMe) driver, the PBAs and the metadata. The system transmits, by the NVMe driver to a controller of the third storage drive, the PBAs and the metadata.

In some embodiments, the system writes, by the third storage drive, the data to the non-volatile memory based on the received management information by performing the following operations. The system stores, by the third storage drive, in a buffer of the third storage drive, the payload as part of a group. The system stores other payloads in the group, wherein the other payloads are associated with other management information. The system determines that a size of the payload and the other payloads meets a predetermined group size. The system writes, from the buffer of the third storage drive to the non-volatile memory, the payload and the other payloads of the group.

In some embodiments, the system writes, by the third storage drive, the data to the non-volatile memory by performing the following operations. The system receives, by a controller of the third storage drive, the data. The controller includes a Non-Volatile Memory Express (NVMe) controller, a double data rate (DDR) controller associated with the volatile memory, a cyclic redundancy check (CRC) module, and a flash controller, wherein the flash controller includes an error correction code (ECC) encoding/decoding module. The system performs, by the CRC module, a first redundancy check on the received data to obtain CRC data. The system stores, by the DDR controller in the first region of the volatile memory, the CRC data. The system determines to write the stored CRC data from the first region of the volatile memory to the non-volatile memory. The system retrieves, by the DDR controller, the stored CRC data. The system performs, by the CRC module, a second redundancy check on the retrieved CRC data to obtain CRC-checked data. Responsive to verifying the CRC-checked data, the system encodes, by the ECC encoding/decoding module of the flash controller, the CRC-checked data to obtain ECC-encoded data. The system writes the ECC-encoded data to the non-volatile memory.

In some embodiments, the data stored in the first region of the first storage drive is transferred from the second storage drive or the first NIC while bypassing the system memory of the first server.

In some embodiments, subsequent to the first storage drive transmitting to the second storage drive the data stored in the first region while bypassing the system memory of the first server, the system retrieves, by the second storage drive, the data stored in the first region while bypassing the system memory of the first server.

BRIEF DESCRIPTION OF THE FIGURES

FIG. 5A illustrates an exemplary environment for data access with a cyclic redundancy check (CRC) in a storage controller, in accordance with an embodiment of the present application.

FIG. 5B illustrates an exemplary environment for data access with a CRC in a storage controller, in accordance with an embodiment of the present application.

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the embodiments described herein are not limited to the embodiments shown, but are to be accorded the widest scope consistent with the principles and features disclosed herein.

Overview

The embodiments described herein provide a system which addresses the inefficiencies associated with data transfers in existing storage systems which consume CPU resources and system memory bandwidth, by providing a system which bypasses the system memory.

As described above, in existing storage systems, a CPU complex can include a CPU and system memory, which can serve as the data hub. Data transfers both within a storage server (e.g., between storage drives of the same storage server) and between storage servers (e.g., between storages drive of different storage servers) can result in multiple folds of memory copy which involve the CPU and system memory, as described below in relation to FIGS. 1A and 1B. These data transfers can result in an increased latency, an increased consumption of memory bandwidth, and an increased utilization of the CPU complex or core. In scenarios which involve a large amount of data transfer, the system performance and resource consumption can suffer and limit the efficiency of the overall storage system.

Figure 4A:
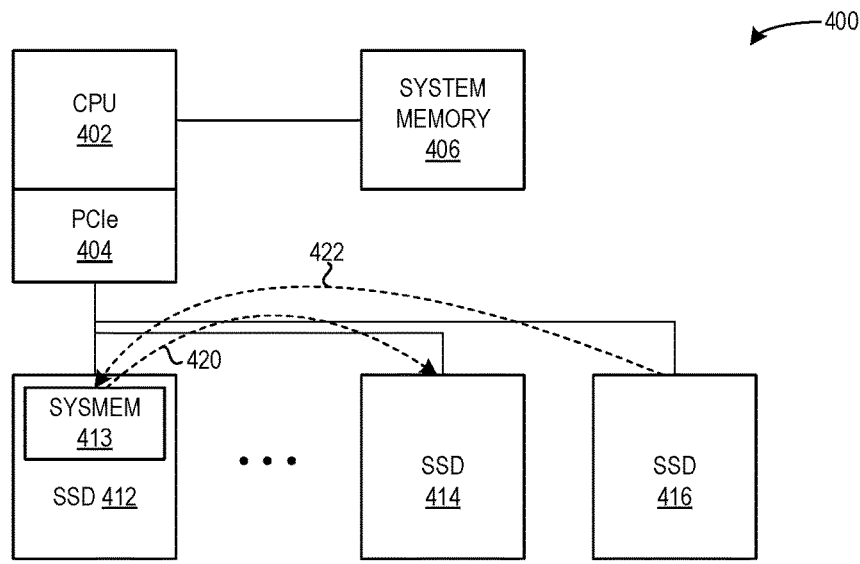
FIG. 4A illustrates an exemplary environment with a data transfer between storage drives in a same storage server, which facilitates bypassing system memory, in accordance with an embodiment of the present application.

The embodiments described herein address these limitations by providing a system which separates the data path and the control path, by allocating or exposing a portion of a volatile memory of a first SSD as a region which can be directly accessed by a second SSD (in a single server scenario, as described below in relation to FIG. 4A) or a network interface card (NIC) (in a storage cluster scenario, as described below in relation to FIG. 4B).

In the single server scenario (where the first and second SSD are associated with the same single server), the first SSD can allocate a region of its volatile memory to be directly accessible by other SSDs (and a NIC) associated with the same single server. The second SSD can subsequently directly access and retrieve data stored in the allocated region of the first SSD, which allows the data transfer to bypass the system memory of the server.

In the storage cluster scenario, when data is transferred from a first storage drive of a first storage server to a second storage drive of a second storage server, the data can pass through a first NIC of the first storage server and a second NIC of the second storage server. Formatting and retrieval of data from the NICs can be used to bypass the system memory, which can result in a more efficient overall storage system.

For example, for data which is to be transferred from the first storage drive to the second storage drive, the first NIC can retrieve the data directly from the allocated region of the first storage drive, while bypassing the system memory. The first NIC can format the data (e.g., into a network packet with formatting information and a payload), and transmit the network packet to the second NIC (e.g., via an Ethernet switch). In the control path, the second NIC can send the metadata to a local storage engine of the second server, which can perform management operations as described below in relation to FIG. 2, and the local storage engine can send the management information (such as the metadata and an assigned physical block address (PBA)) to the second storage drive. In the data path, the second NIC can send to the second storage drive (and the second storage drive can receive or retrieve from the second NIC) the data as the payload only directly from the second NIC, again bypassing the system memory.

Thus, by allocating a region of the non-volatile memory of a first storage drive and making the allocated region directly accessible to a second storage drive in the same first server, the system can bypass system memory of the first server in the single server scenario. Furthermore, by allocating the region of the first storage drive and making the allocated region directly accessible to the first NIC (e.g., in the same first server), and by allowing data stored in a second NIC to be accessible by a third storage drive in the same second server (e.g., data stored in the second NIC is accessible by the third storage drive in the second server), the system can also bypass system memory in the storage cluster scenario.

The described embodiments can also perform consecutive data fetching based on groups in a write cache of the SSD controller, as described below in relation to FIG. 3. In addition, the described embodiments can ensure the integrity of the data stored in the volatile memory of a storage drive, as described below in relation to FIG. 5.

A "distributed storage system" or a "storage system" can include multiple storage servers. A "storage server" or a "storage system" can refer to a computing device which can include multiple storage devices or storage drives. A "storage device" or a "storage drive" refers to a device or a drive with a non-volatile memory which can provide persistent storage of data, e.g., a solid-state drive (SSD), or a flash-based storage device. A storage system can also be a computer system.

"Non-volatile memory" refers to storage media which may be used for persistent storage of data, e.g., flash memory of a NAND die of an SSD, magnetoresistive random access memory (MRAM), phase change memory (PCM), resistive random access memory (ReRAM), or another non-volatile memory.

"Volatile memory" refers to storage media which can include, e.g., dynamic random access memory (DRAM), double data rate (DDR) DRAM, and DDR dual in-line memory modules (DIMM). In general, data stored in volatile memory is not protected in the event of a power loss or other failure. In some cases, volatile memory can be protected from such data loss with a power protection module or other power loss component.

The terms "sysmem" and "region of a volatile memory" are used interchangeably in this disclosure and refer to a portion of a volatile memory of a first storage drive, where the portion or region is allocated to be accessed directly by a second storage drive or a NIC, and where the first storage drive, the second storage drive, and the NIC are associated with the same server. The allocated sysmem or region can serve as system memory for the storage device in a more efficient manner than the conventional system memory associated with a host or a storage server.

A "computing device" refers to any server, device, node, entity, drive, or any other entity which can provide any computing capabilities.

The term "write cache" refers to a data cache, buffer, or region which can store data in a persistent memory or a non-volatile memory.

Exemplary Data Transfer in the Prior Art

Figure 1A:
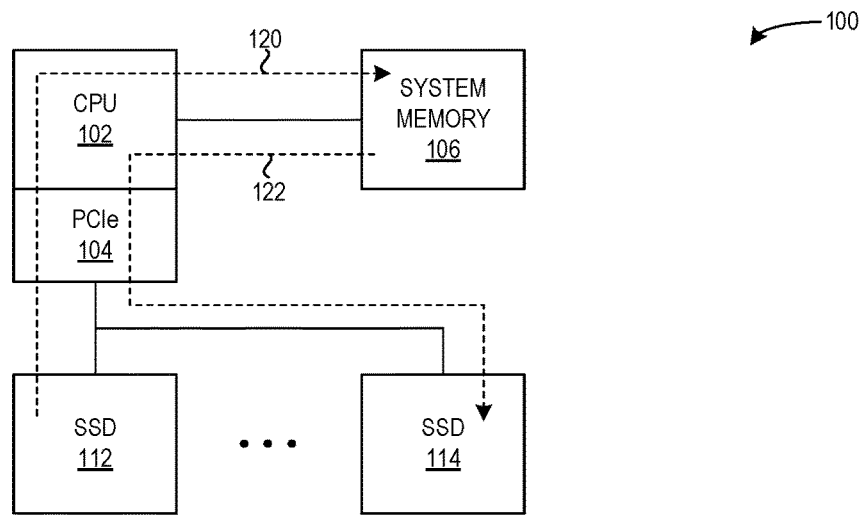
FIG. 1A illustrates an exemplary environment with a data transfer between storage drives in a same storage server, in accordance with the prior art.

FIG. 1A illustrates an exemplary environment 100 with a data transfer between storage drives in a same storage server, in accordance with the prior art. Environment 100 can include: a central processing unit (CPU) 102, an associated Peripheral Component Interconnect Express (PCIe) interface 104, and an associated system memory 106; and solid state drives (SSDs) 112 and 114. CPU 102 can communicate with SSDs 112 and 114 via PCIe interface 104. During operation, in order to move data from one drive to another drive (e.g., from a source drive such as SSD 112 to a destination drive such as SSD 114), the data is first copied from the source drive into system memory, i.e., transferred from SSD 112, via PCIe 104, to CPU 102, to system memory 106 (via a communication 120). The data is then written from system memory to the destination drive, i.e., transferred from system memory 106 to CPU 102 and, via PCIe 304, to SSD 114 (via a communication 122). Thus, the host CPU and system memory are involved in the transfer of data from the source storage drive to the destination storage drive, which can increase the latency and inefficiency of the overall storage system.

Figure 1B:
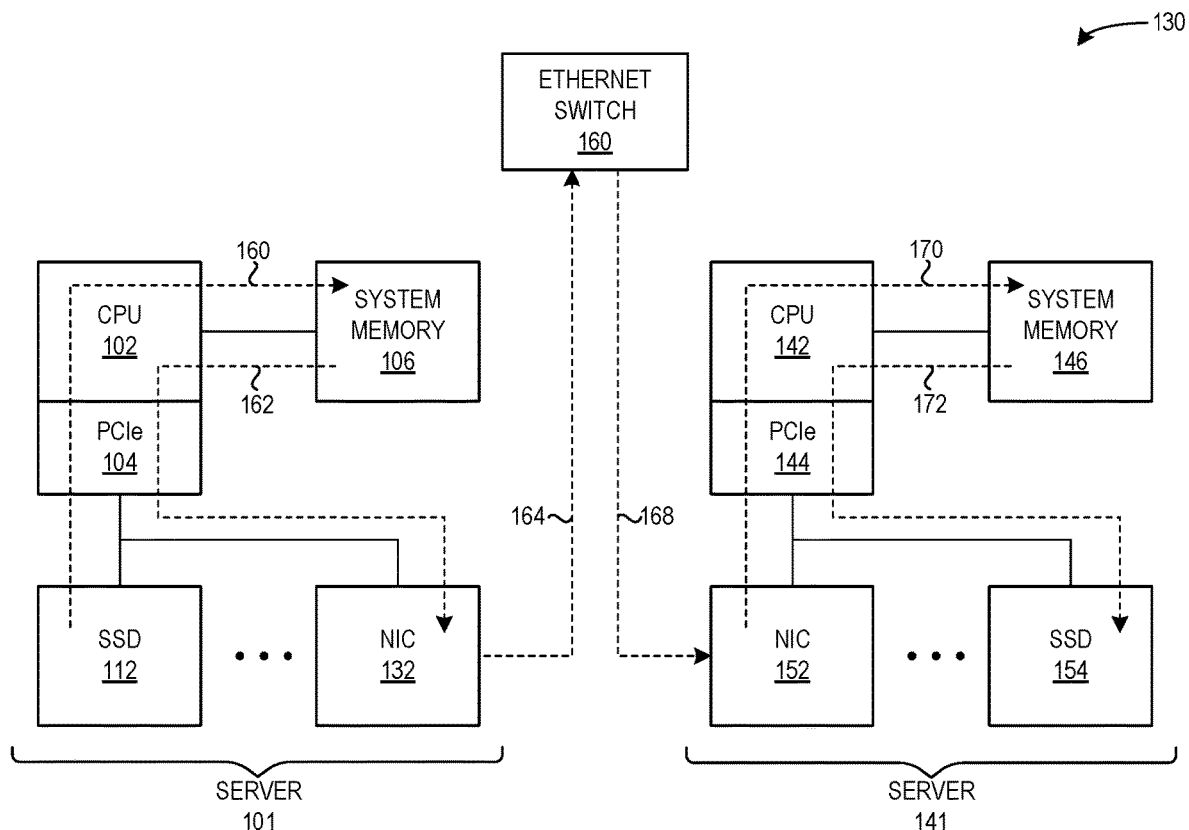
FIG. 1B illustrates an exemplary environment with a data transfer between storage drives in different storage servers, in accordance with the prior art.

FIG. 1B illustrates an exemplary environment 130 with a data transfer between storage drives in different storage servers, in accordance with the prior art. Environment 130 can include an Ethernet switch 160 and a cluster of servers, where each server can include a CPU and a system memory, and be associated with multiple SSDs and a network interface card (NIC). For example, a first server 101 can include: a CPU 102, an associated PCIe interface 104, and an associated system memory 106; one or more SSDs, such as an SSD 112; and a NIC 132. A second server 141 can include: a CPU 142, an associated PCIe interface 144, and an associated system memory 146; one or more SSDs, such as an SSD 154; and a NIC 152. CPU 102 can communicate with SSD 112 via PCIe interface 104, and CPU 142 can communicate with SSD 154 via PCIe interface 144. The two depicted servers 101 and 141 can communicate with each other through Ethernet switch 160 via their respective NICs 132 and 152.

During operation, in order to move data from one drive in the first server to another drive in the second server (e.g., from a source drive such as SSD 112 of server 101 to a destination drive such as SSD 154 of server 141), the data is first copied from the source drive into system memory of the first server, i.e., transferred from SSD 112, via PCIe 104, to CPU 102, to system memory 106 (via a communication path 160). The data is then written from system memory to NIC 132, i.e., transferred from system memory 106 to CPU 102 and, via PCIe 104, to NIC 132 (via a communication path 162). NIC 132 can generate formatting information for the data, and perform other packet processing, data reordering, and concatenation operations.

NIC 132 can transfer the formatted data (e.g., formatting information and payload) to Ethernet switch 160 (via a communication 164), and, based on the formatting information, Ethernet switch 160 can transfer the data to NIC 152 (via a communication 168). NIC 152 can perform packet processing, data reordering, and concatenation operations. NIC 152 can send the data to be copied into system memory of the second server, i.e., transferred from NIC 152, via PCIe 144, to CPU 142, to system memory 146 (via a communication path 170). The data is then written from system memory to the destination drive, i.e., transferred from system memory 146 to CPU 142 and, via PCIe 144, to SSD 154 (via a communication path 172).

Thus, in environment 130, the host CPU and system memory of both servers are involved in the transfer of data from the source storage drive to the destination storage drive, which can increase the latency and inefficiency of the overall storage system. In addition, the NICs of both servers can consume a non-trivial amount of time, energy, bandwidth, and other resources on packet processing, data reordering, concatenation, and other operations related to formatting and processing network packets. These operations can further increase the latency and inefficiency of the overall storage system.

Moreover, in the storage cluster depicted in environment 130, the system can experience a non-trivial amount of traffic due to, e.g., managing data replicas, rebalancing data, etc. Moving multiple copies of data within the storage cluster can result in a performance bottleneck due to the latency involved in memory copy operations, as described above.

Exemplary Environment with Separate Control and Data Paths

Figure 2:
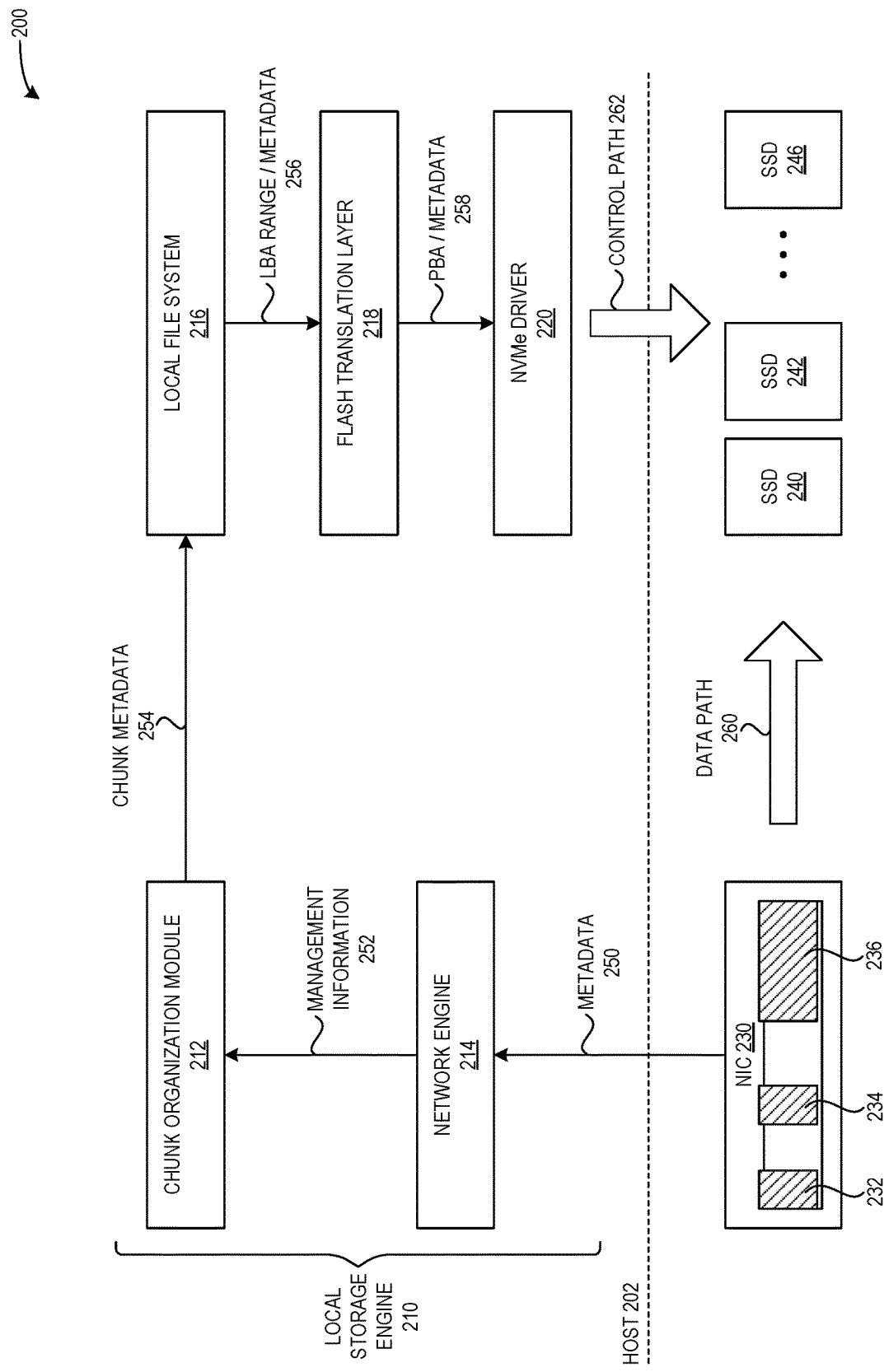
FIG. 2 illustrates an exemplary environment with separate control and data paths, which facilitates bypassing system memory, in accordance with an embodiment of the present application.

FIG. 2 illustrates an exemplary environment 200 with separate control and data paths, which facilitates bypassing system memory, in accordance with an embodiment of the present application. Environment 200 can include: a host 202 with a local storage engine 210; a NIC 230; and SSDs 240, 242, and 246. Local storage engine can include: a network engine 214; a chunk organization module 212; a local file system 216; a flash translation layer (FTL) module 218; and a Non-Volatile Memory Express (NVMe) driver 220.

NIC 230 can store data as formatted data which includes formatting information and a payload. For example, payloads 232, 234, and 236 are indicated in FIG. 2 with left-slanting diagonal lines. Assume that metadata 250 is associated with the data indicated by payload 234 in NIC 230. NIC 230 can send metadata 250 to host 202 for processing, and host 202, after processing the metadata as described below, can send a physical block address (PBA) and metadata back to SSDs 240-246 (via a control path 262). At the same or a similar time, NIC 230 can send the payload data itself directly to SSDs 240-246 (e.g., via a data path 260).

Local storage engine 210 can perform a series of operations on metadata 250. Upon receiving metadata 250 from NIC 230, network engine 214 can generate management information, e.g., an order, a merged size, and other metadata for the data indicated by payload 234. Network engine 214 can send management information 252 to chunk organization module 212.

Chunk organization module 212 can group received network packets into multiple chunks in parallel, and can send chunk metadata 254 to local file system 216. Local file system 216 can use chunk metadata 254 to allocate the logical extent (e.g., a range of logical block addresses (LBAs)) to accommodate the data, and can send LBA range/metadata 256 to FTL module 218.

FTL module 218 can receive the incoming LBAs, including LBAs allocated to chunks associated with the data indicated by payload 234, from multiple chunks in a random order, which is similar to the pattern associated with a random write operation. FTL module 218 can implement the mapping of the LBAs to physical block addresses (PBAs), e.g., by generating or mapping PBAs for the incoming LBAs, and storing the mapping in a data structure. FTL module 218 can send PBA/metadata 258 to NVMe driver 220, which can perform any necessary data processing, and can send PBA/metadata 258 to controllers (not shown) of SSDs 240-246, via control path 262.

The PBA and metadata information received by controllers of SSDs 240-246 via control path 262, along with the payload data received by the controllers of SSDs 240-246 via control path 260, can accomplish the programming of the NAND flash in SSDs 240-246. Thus, the operations and communications depicted in environment 200 demonstrate how the local storage engine collaborating with the SSD controller for metadata/data transmission can result in an improved system for both data transmission and storage efficiency.

Data Movement from a NIC to a Storage Drive

Figure 3:
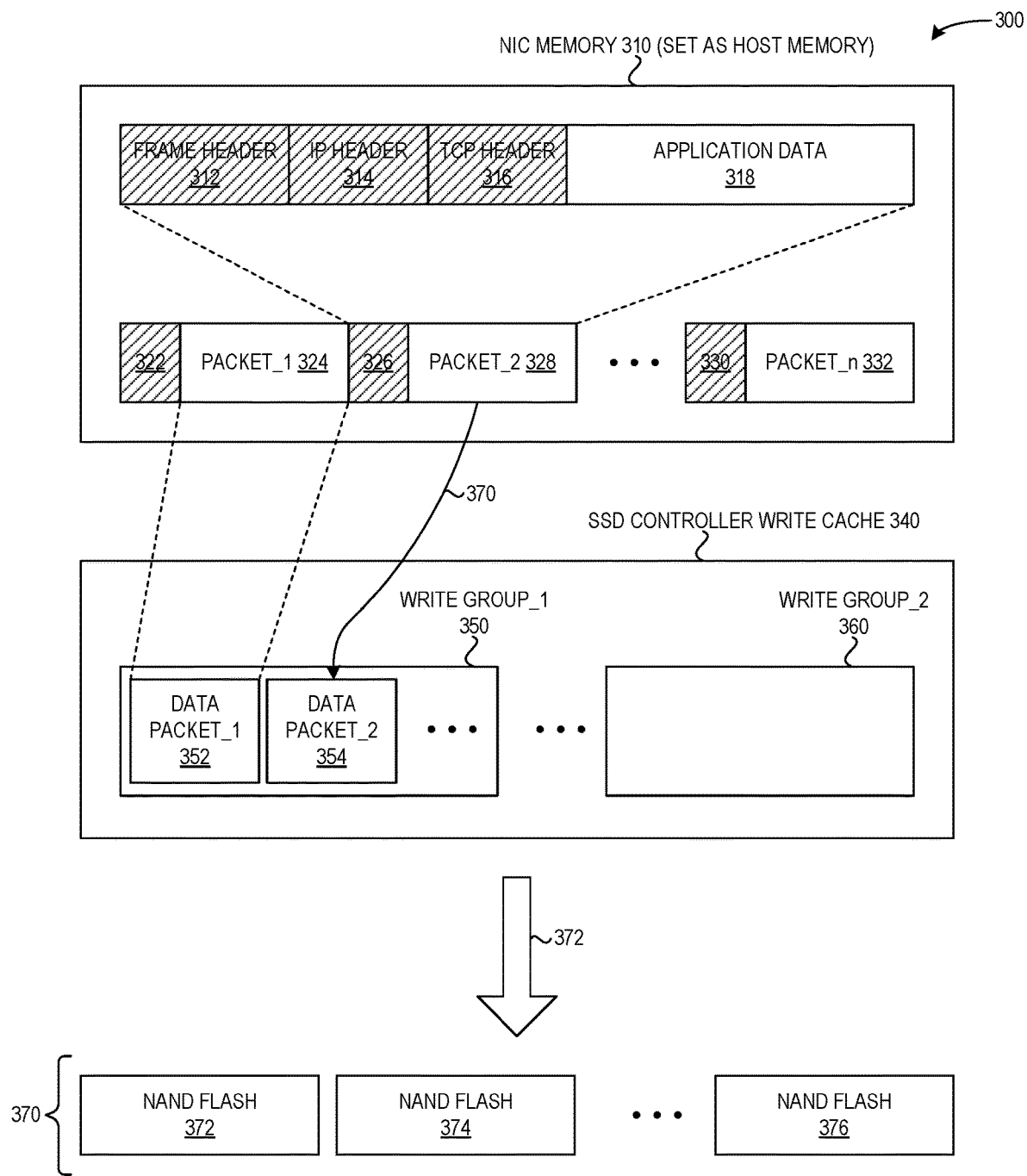
FIG. 3 illustrates an exemplary environment with data movement from a network interface card to a storage drive, in accordance with an embodiment of the present application.

FIG. 3 illustrates an exemplary environment 300 with data movement from a network interface card to a storage drive, in accordance with an embodiment of the present application. Environment 300 can include: a NIC memory 310 (which is set as host memory); an SSD controller write cache 340; and a non-volatile memory 370, such as NAND flash storage modules, units, or components 372, 374, and 376. NIC memory 310 can store formatted data, which can include formatting information and a payload. For example, NIC memory can store network packets as: formatting information 322 for a payload or application data indicated by a packet_1 324; formatting information 326 for a payload or application data indicated by a packet_2 328; and formatting information 330 for a payload or application data indicated by a packet_n 332.

Each network packet can include formatting information and a payload or application data. For example, formatting information 326 and packet_2 328 can include: a frame header 312, an Internet Protocol (IP) header 314, and a Transmission Control Protocol (TCP) header 316 which are part of formatting information 326, as indicated by right-slanting diagonal lines; and application data 318, which can correspond to the payload of packet_2 328.

The SSD controller can store data in write cache 340 in write groups of a predetermined size, and when the data stored in a given write group reaches the predetermined size, the SSD controller can write the data in the given write group to the NAND flash. For example, write cache 340 can include a write group_1 350 and a write group_2 360. Environment 300 can depict that the payload or application data indicated by packet_1 324 has been written as a data packet_1 352 to write group_1 350 of write cache 340. Another payload can then be written to write group_1 350, as indicated by packet_2 328 being written to write group_1 350 as a data packet_2 354 (via a communication 370).

The system can determine that the data stored in write group _1 350 meets or has reached a predetermined group size, and can write the data to non-volatile memory 370 (i.e., NAND flash 372-376). The predetermined group size can be based on, e.g., a size of a page in the NAND flash or a number of available channels for processing data in a parallel manner.

Exemplary Environment for Data Transfer: Single Server Scenario and Storage Cluster Scenario FIG. 4A illustrates an exemplary environment 400 with a data transfer between storage drives in a same storage server, which facilitates bypassing system memory, in accordance with an embodiment of the present application. Environment 400 can include: a central processing unit (CPU) 402, an associated Peripheral Component Interconnect Express (PCIe) interface 404, and an associated system memory 406; and solid-state drives (SSDs) 412, 414, and 416. A respective SSD can expose a portion of its memory as system memory, which allows other SSDs (or a NIC) in the same server to directly retrieve data from the exposed system memory of the respective SSD. The other SSDs can also send data directly to this exposed system memory on the respective SSD.

For example, during operation, the system can allocate, in the volatile memory of SSD 412, a first region (system memory or sysmem) 413 to be accessed directly by a second storage drive (such as SSD 414 via a communication 420) or a first NIC (as described below in relation to FIG. 4B). In addition, SSD 416 (or SSD 414) can send or write data directly to the allocated first region (system memory) 413 of SSD 412 (via, e.g., a communication 422). This allows data to be retrieved from or written to SSD 412 while bypassing system memory 406, thus eliminating the need to copy the data into the system memory or DIMM of the server itself (which challenge is described above in relation to the prior art environment of FIG. 1A).

Figure 4B:
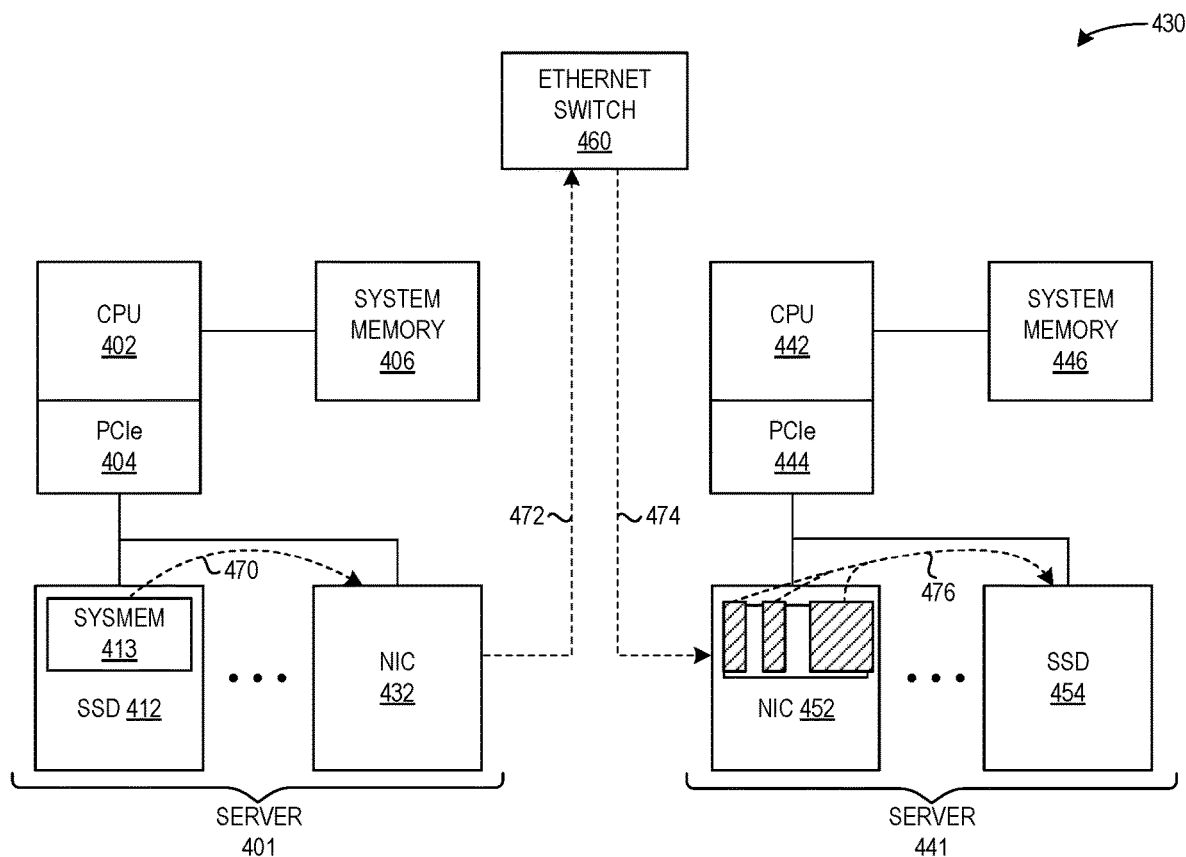
FIG. 4B illustrates an exemplary environment with a data transfer between storage drives in different storage servers, which facilitates bypassing system memory, in accordance with an embodiment of the present application.

FIG. 4B illustrates an exemplary environment 430 with a data transfer between storage drives in different storage servers, which facilitates bypassing system memory, in accordance with an embodiment of the present application. Environment 430 can include an Ethernet switch 460 and a cluster of servers, where each server can include a CPU and a system memory, and be associated with multiple SSDs and a network interface card (NIC). For example, a first server 401 can include: a CPU 402, an associated PCIe interface 404, and an associated system memory 406; one or more SSDs, such as an SSD 412; and a NIC 432. A second server 441 can include: a CPU 442, an associated PCIe interface 444, and an associated system memory 446; one or more SSDs, such as an SSD 454; and a NIC 452. The two depicted servers 401 and 441 can communicate with each other through Ethernet switch 460 via their respective NICs 432 and 452.

A first SSD of the first server can expose a portion of its memory as system memory, which allows a first NIC of the first server to directly retrieve data from the exposed system memory of the respective SSD. The first NIC can send the retrieved data, along with network formatting information, to a second NIC of a second server. A second SSD of the second server can retrieve the data directly from the second NIC (as described above in relation to FIG. 3.

For example, during operation, the system can allocate, in the volatile memory of SSD 412, a first region (system memory or sysmem) 413 to be accessed directly by NIC 432 (or by other SSDs of server 401). SSD 412 can store data in the allocated first region sysmem 413. SSD 454 can generate a request to retrieve data from SSD 412 (or the system can determine that SSD 412 is to send data to SSD 454). NIC 432 can retrieve the requested data from sysmem 413 of SSD 412 (via a communication 470). NIC 432 can generate formatting information for the data, and perform other packet processing, data reordering, and concatenation operations, i.e., by adjusting the data into a predefined format such as described above in relation to FIG. 3.

NIC 432 can transfer the formatted data (including formatting information and payload) to Ethernet switch 460 (via a communication 472), and, based on the formatting information, Ethernet switch 460 can transfer the data to NIC 452 (via a communication 474). NIC 452 can perform packet processing, data reordering, and concatenation operations. NIC 452 can store the data as formatted data which includes formatting information and a payload. NIC 452 can send the payload data directly to SSD 454 (via communications 476, which can correspond to the operations described above in relation to FIG. 2). SSD 454 can also allocate a region (not shown) of its volatile memory as a system memory which can be accessed directly by NIC 452 or other SSDs of server 441. Moreover, SSD 454 can retrieve the payload data directly from NIC 452 by accessing the formatted data and selecting only the portions of payload data, e.g., by dropping the formatting information or formatting bits (via communications 476). SSD 454 can then group the data and write the data to its NAND flash based on the pages and PBAs as assigned by the FTL at the host side, as described above in relation to FIG. 2.

Thus, FIG. 4B depicts an environment or system which allows data to be retrieved from (or written to) SSD 412 by SSD 454 while bypassing both system memory 406 and 446, thus eliminating the need to copy the data into the system memory or DIMM of both servers 401 and 441 (which challenge is described above in relation to the prior art environment of FIG. 1B).

Controller Operations for Ensuring Data Quality

FIG. 5A illustrates an exemplary environment 500 for data access with a cyclic redundancy check (CRC) in a storage controller, in accordance with an embodiment of the present application. Environment 500 can include a storage controller with associated components or modules, and can also include a volatile memory of a storage device and non-volatile memory of the storage device. The storage controller can include: a PCIe physical layer (PHY) 510; an NVMe controller 512; a DDR controller 514; a cyclic redundancy check (CRC) module 518; and a flash controller 520 with an error correction code (ECC) encoding/decoding module 522. DDR controller 514 can communicate with a volatile memory DDR 516 and an allocated region sysmem 517 of volatile memory 516. Note that sysmem 517 can serve as the allocated and exposed region of system memory which can be directly accessed by other SSDs or the NIC in the same server. For example, sysmem 517 can correspond to sysmem 413 of SSD 412 of FIG. 4A, as the allocated region from which data can be directly retrieved (e.g., communication 420) or to which data can be directly written (e.g., communication 420) by a storage device of the same server. Sysmem 517 can also correspond to sysmem 413 of FIG. 4B, as the allocated region from which data can be directly retrieved by a NIC of the same server (e.g., communication 470).

Data can be sent to or received from host 530, and can also be sent to or received from NAND flash 532. For example, as indicated by a communication path 534, data can be received from host 530. This data can be the data fetched directly from the allocated sysmem which bypasses the server's system memory or DIMM. The fetched data can travel through PCIe PHY 510 to NVMe controller 512, and NVMe controller 512 can operate to process the data as needed. CRC 518 can perform a CRC check on the data, which can then be passed via DDR controller 514 to be temporarily buffered, with power loss protection, in sysmem 517 of DDR 516 (as indicated by communication path 534).

Subsequently, as indicated by a communication path 536, the data can be sent to the NAND flash. When reading out the stored data from sysmem 517 of DDR 516, the data is passed via DDR controller 514 back to CRC 518, which can check the CRC to ensure the integrity, correctness, or accuracy of the data. CRC 518 can send the CRC-checked data to ECC 522 of flash controller 520. ECC 522 can perform ECC encoding on the data, and can send the ECC-encoded data to the NAND flash (via 532 as part of communication path 536).

FIG. 5B illustrates an exemplary environment 540 for data access with a CRC in a storage controller, in accordance with an embodiment of the present application. Environment 540 can include a CRC module 542, a memory module 544, and a CRC module 546. CRC modules 542 and 546 can correspond to CRC module 518 of FIG. 5A; memory 544 can correspond to sysmem 517 of DDR 516 of FIG. 5A; a path 554 can correspond to path 534 of FIG. 5A; and a path 556 can correspond to path 536 of FIG. 5A.

Environment 540 depicts a high-level view of the communications described above in relation to FIG. 5A. During operation, the system (by CRC 542) can receive data to be stored in non-volatile memory via path 554. CRC 542 can perform a first redundancy check and send the CRC data to memory 544 (via path 554). The system can store the CRC data in memory 544, and can subsequently retrieve (by CRC 546) the stored CRC data from memory 544. CRC 546 can perform a second redundancy check, and send the CRC-checked data onwards, e.g., to ECC 522 (via path 556).

Figure 6A:
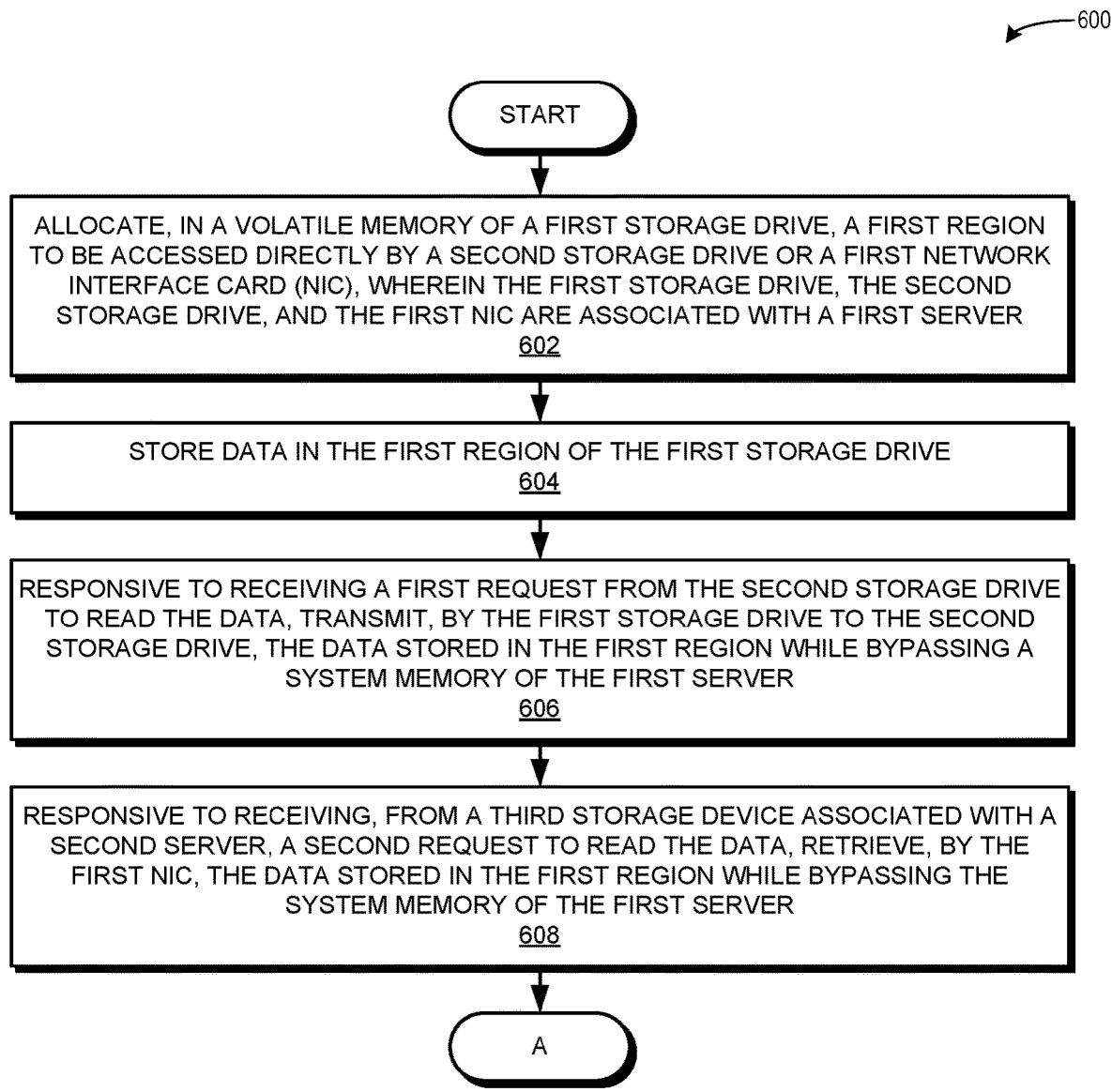
FIG. 6A presents a flowchart illustrating a method for facilitating data movement while bypassing system memory, including a data transfer between storage drives in a same storage server, in accordance with an embodiment of the present application.

Method for Facilitating Data Movement by Bypassing System Memory: Single Server Scenario and Storage Cluster Scenario FIG. 6A presents a flowchart 600 illustrating a method for facilitating data movement while bypassing system memory, including a data transfer between storage drives in a same storage server, in accordance with an embodiment of the present application. During operation, the system allocates, in a volatile memory of a first storage drive, a first region to be accessed directly by a second storage drive or a first network interface card (NIC), wherein the first storage drive, the second storage drive, and the first NIC are associated with a first server (operation 602). The system stores data in the first region of the first storage drive (operation 604). Responsive to receiving a first request from the second storage drive to read the data, the system transmits, by the first storage drive to the second storage drive, the data stored in the first region while bypassing a system memory of the first server (operation 606). Responsive to receiving, from a third storage drive associated with a second server, a second request to read the data, the system retrieves, by the first NIC, the data stored in the first region while bypassing the system memory of the first server (operation 608). The operation continues at Label A of FIG. 6B.

Figure 6B:
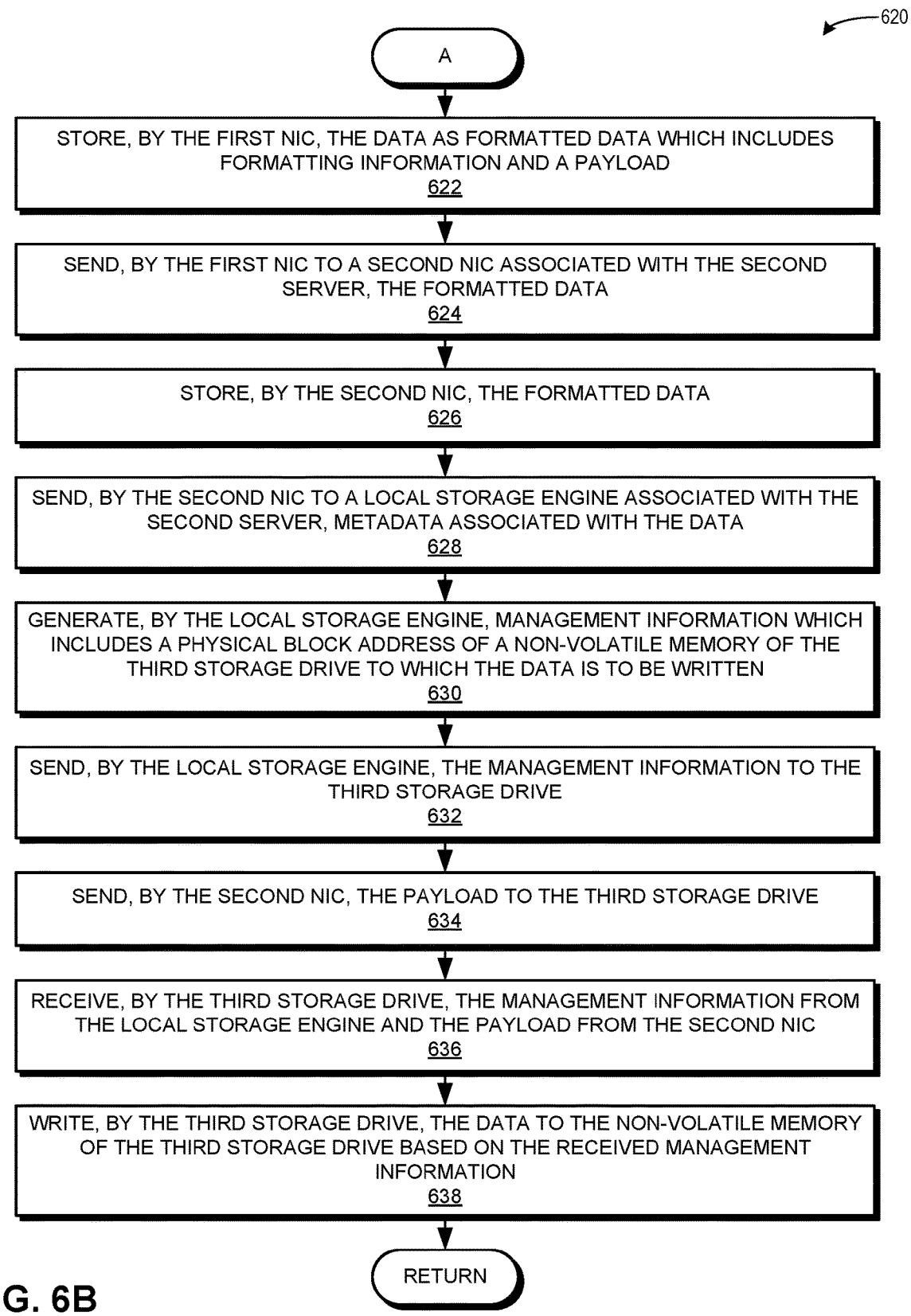
FIG. 6B presents a flowchart illustrating a method for facilitating data movement while bypassing system memory, including a data transfer between storage drives in different storage servers, in accordance with an embodiment of the present application.

FIG. 6B presents a flowchart 620 illustrating a method for facilitating data movement while bypassing system memory, including a data transfer between storage drives in different storage servers, in accordance with an embodiment of the present application. The system stores, by the first NIC, the data as formatted data which includes formatting information and a payload (operation 622). The system sends, by the first NIC to a second NIC associated with the second server, the formatted data (operation 624). The system stores, by the second NIC, the formatted data (operation 626). The system sends, by the second NIC to a local storage engine associated with the second server, metadata associated with the data (operation 628).

The system generates, by the local storage engine, management information which includes a physical block address of a non-volatile memory of the third storage drive to which the data is to be written (operation 630). The system sends, by the local storage engine, the management information to the third storage drive (operation 632). The system sends, by the second NIC, the payload to the third storage drive (operation 634). The system receives, by the third storage drive, the management information from the local storage engine and the payload from the second NIC (operation 636). The system writes, by the third storage drive, the data to the non-volatile memory of the third storage drive based on the received management information (operation 638), and the operation returns.

Figure 7:
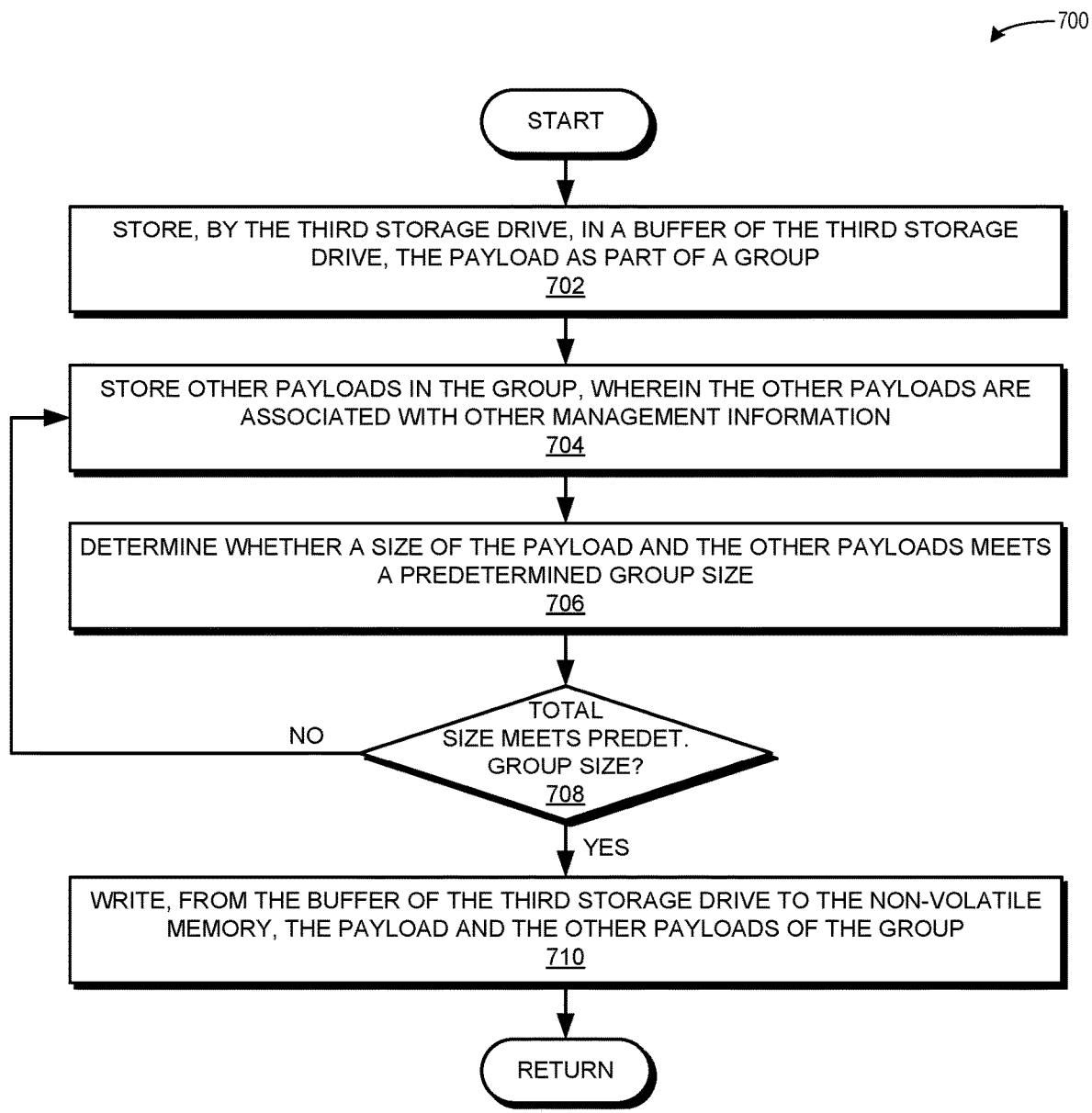
FIG. 7 presents a flowchart illustrating a method for facilitating data movement while bypassing system memory, including writing data in groups to a non-volatile memory, in accordance with an embodiment of the present application.

Method for Facilitating Data Movement by Writing Data in Groups to a Non-Volatile Memory FIG. 7 presents a flowchart 700 illustrating a method for facilitating data movement while bypassing system memory, including writing data in groups to a non-volatile memory, in accordance with an embodiment of the present application. During operation, the system stores, by the third storage drive, in a buffer of the third storage drive, the payload as part of a group (operation 702). The system stores other payloads in the group, wherein the other payloads are associated with other management information (operation 704). The system determines whether a size of the payload and the other payloads meets a predetermined group size (operation 706). If it does not (decision 708), the operation returns to operation 704. If it does (decision 708), the system writes, from the buffer of the third storage drive to the non-volatile memory, the payload and the other payloads of the group (operation 710). Writing the payload and the other payloads of the group to the non-volatile memory can be based on the PBA, metadata, and other management information received from a local storage engine of a host, as described above in relation to FIG. 2.

Figure 8:
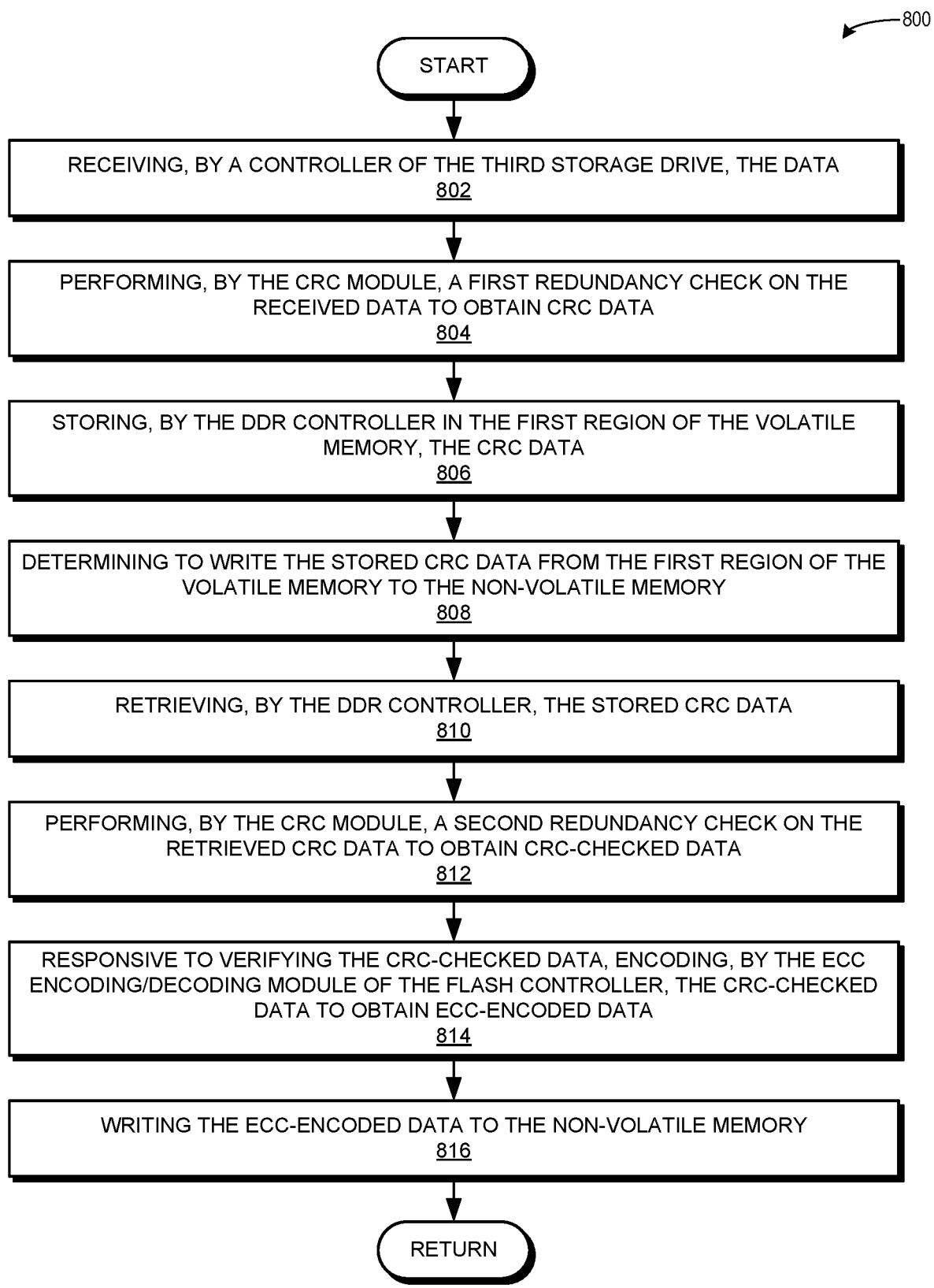
FIG. 8 presents a flowchart illustrating a method for facilitating data movement while bypassing system memory, including operations to ensure data integrity, in accordance with an embodiment of the present application.

FIG. 8 presents a flowchart 800 illustrating a method for facilitating data movement while bypassing system memory, including operations to ensure data integrity, in accordance with an embodiment of the present application. During operation, the system receives, by a controller of the third storage drive, the data (operation 802). The controller can include a Non-Volatile Memory Express (NVMe) controller, a double data rate (DDR) controller associated with the volatile memory, a cyclic redundancy check (CRC) module, and a flash controller. The flash controller can include an error correction code (ECC) encoding/decoding module. The system performs, by the CRC module, a first redundancy check on the received data to obtain CRC data (operation 804). The system stores, by the DDR controller in the first region of the volatile memory, the CRC data (operation 806). The system determines to write the stored CRC data from the first region of the volatile memory to the non-volatile memory (operation 808). This determination can be based on a size of a write group in a write cache or buffer of the SSD controller, as described above in relation to FIG. 3.

The system retrieves, by the DDR controller, the stored CRC data (operation 810). The system performs, by the CRC module, a second redundancy check on the retrieved CRC data to obtain CRC-checked data (operation 812). Responsive to verifying the CRC-checked data, the system encodes, by the ECC encoding/decoding module of the flash controller, the CRC-checked data to obtain ECC-encoded data (operation 814). The system writes the ECC-encoded data to the non-volatile memory (operation 816), and the operation returns.

Exemplary Computer System and Apparatus

Figure 9:
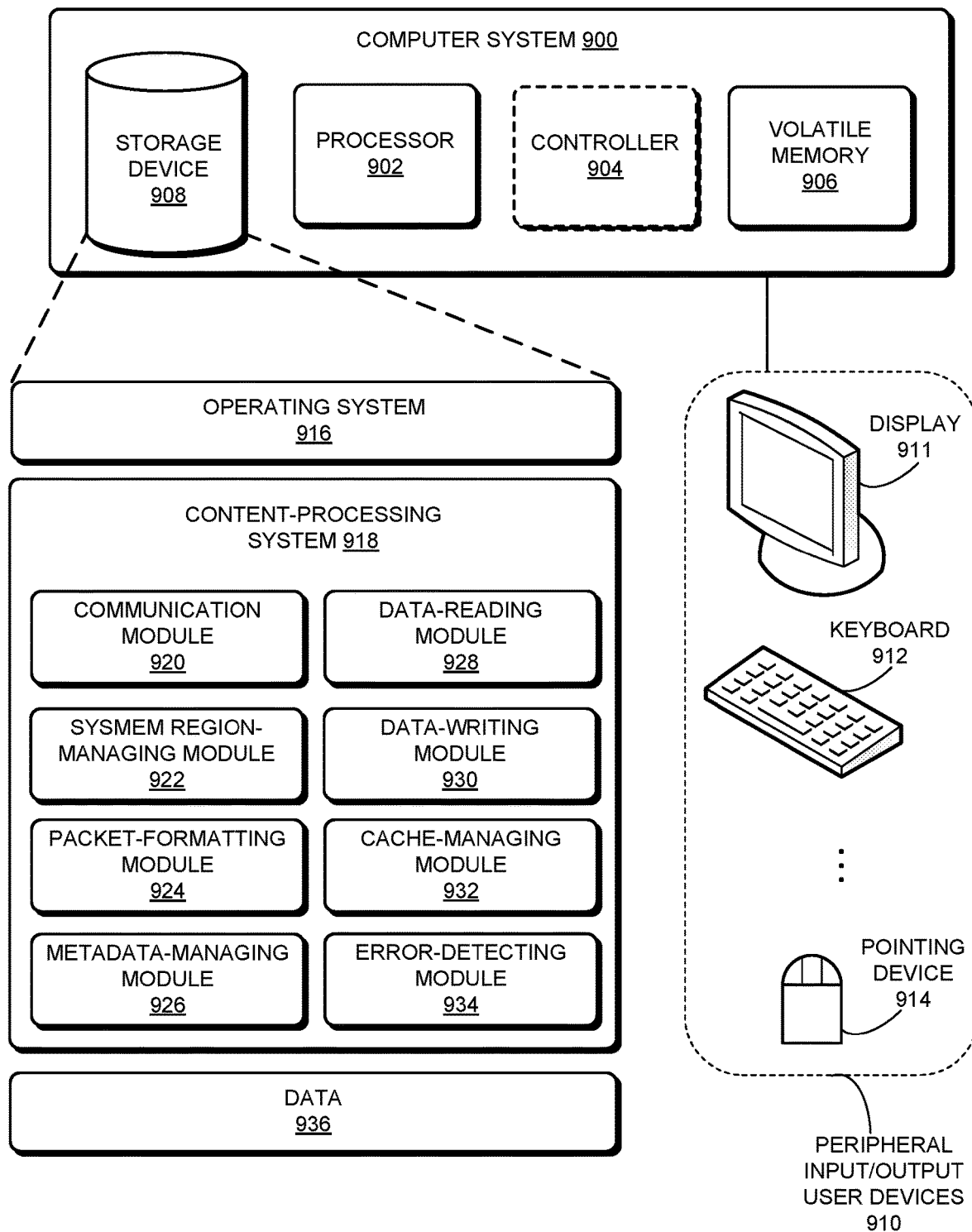
FIG. 9 illustrates an exemplary computer system that facilitates data movement while bypassing system memory, in accordance with an embodiment of the present application.

FIG. 9 illustrates an exemplary computer system 900 that facilitates data movement while bypassing system memory, in accordance with an embodiment of the present application. Computer system 900 includes a processor 902, a volatile memory 906, and a storage device 908. In some embodiments, computer system 900 can include a controller 904 (indicated by the dashed lines). Volatile memory 906 can include, e.g., random access memory (RAM), that serves as a managed memory, and can be used to store one or more memory pools. Storage device 908 can include persistent storage which can be managed or accessed via processor 902 (or controller 904). Furthermore, computer system 900 can be coupled to peripheral input/output (I/O) user devices 910, e.g., a display device 911, a keyboard 912, and a pointing device 914. Storage device 908 can store an operating system 916, a content-processing system 918, and data 936.

Content-processing system 918 can include instructions, which when executed by computer system 900, can cause computer system 900 or processor 902 to perform methods and/or processes described in this disclosure. Specifically, content-processing system 918 can include instructions for receiving and transmitting data packets, including data to be read or written, an input/output (I/O) request (e.g., a read request or a write request), metadata, management information, a PBA, an LBA, a payload, formatting information, CRC data, and ECC-encoded data (communication module 920).

Content-processing system 918 can further include instructions for allocating, in a volatile memory of a first storage drive, a first region to be accessed directly by a second storage drive or a first network interface card (NIC), wherein the first storage drive, the second storage drive, and the first NIC are associated with a first server (sysmem region-managing module 922). Content-processing system 918 can include instructions for storing data in the first region of the first storage drive (data-writing module 930). Content-processing system 918 can include instructions for, responsive to receiving a first request from the second storage drive to read the data (communication module 920), transmitting, by the first storage drive to the second storage drive, the data stored in the first region while bypassing a system memory of the first server (communication module 920 and sysmem region-managing module 922). Content-processing system 918 can also include instructions for, responsive to receiving, from a third storage drive associated with a second server, a second request to read the data (communication module 920), retrieving, by the first NIC, the data stored in the first region while bypassing the system memory of the first server (data-reading module 928 and sysmem region-managing module 922).

Content-processing system 918 can additionally include instructions for storing, by the first NIC, the data as formatted data which includes formatting information and a payload (packet-formatting module 924). Content-processing system 918 can include instructions for sending, by the first NIC to a second NIC associated with the second server, the formatted data (communication module 920). Content-processing system 918 can include instructions for storing, by the second NIC, the formatted data (data-writing module 930). Content-processing system 918 can include instructions for sending, by the second NIC to a local storage engine associated with the second server, metadata associated with the data (communication module 920 and metadata-managing module 926). Content-processing system 918 can also include instructions for generating, by the local storage engine, management information which includes a physical block address of a non-volatile memory of the third storage drive to which the data is to be written (metadata-managing module 920). Content-processing system 918 can include instructions for sending, by the local storage engine, the management information to the third storage drive (communication module 920 and metadata-managing module 926). Content-processing system 918 can include instructions for sending, by the second NIC, the payload to the third storage drive (communication module 920). Content-processing system 918 can include instructions for receiving, by the third storage drive, the management information from the local storage engine and the payload from the second NIC (communication module 920). Content-processing system 918 can include instructions for writing, by the third storage drive, the data to the non-volatile memory of the third storage drive based on the received management information (data-writing module 930). Content-processing system 918 can include instructions for performing the operations described above in relation to FIG. 2.

Content-processing system 918 can further include instructions for storing, by the third storage drive, in a buffer of the third storage drive, the payload as part of a group (data-writing module 930 and cache-managing module 932). Content-processing system 918 can include instructions for storing other payloads in the group, wherein the other payloads are associated with other management information (data-writing module 930 and cache-managing module 932). Content-processing system 918 can include instructions for determining that a size of the payload and the other payloads meets a predetermined group size (cache-managing module 932). Content-processing system 918 can include instructions for writing, from the buffer of the third storage drive to the non-volatile memory, the payload and the other payloads of the group (data-writing module 930). Content-processing system 918 can include instructions for performing the operations described above in relation to FIG. 7.

Content-processing system 918 can also include instructions for receiving, by a controller of the third storage drive, the data (communication module 920). Content-processing system 918 can include instructions for performing, by the CRC module, a first redundancy check on the received data to obtain CRC data (error-detecting module 934). Content-processing system 918 can include instructions for storing, by the DDR controller in the first region of the volatile memory, the CRC data (data-writing module 930 and sysmem region-managing module 922). Content-processing system 918 can include instructions for determining to write the stored CRC data from the first region of the volatile memory to the non-volatile memory (sysmem region-managing module 922). Content-processing system 918 can include instructions for retrieving, by the DDR controller, the stored CRC data (data-reading module 928). Content-processing system 918 can include instructions for performing, by the CRC module, a second redundancy check to obtain CRC-checked data (error-detecting module 934). Content-processing system 918 can include instructions for, responsive to verifying the CRC checked data, encoding, by the ECC encoding/decoding module of the flash controller, the CRC-checked data to obtain ECC-encoded data (error-detecting module 934). Content-processing system 918 can include instructions for writing the ECC-encoded data to the non-volatile memory (data-writing module 930). Content-processing system 918 can include instructions for performing the operations described above in relation to FIG. 8.

Data 936 can include any data that is required as input or generated as output by the methods and/or processes described in this disclosure. Specifically, data 936 can store at least: data; a request; a read request; a write request; an input/output (I/O) request; data or metadata associated with a read request, a write request, or an I/O request; formatted data; encoded data; CRC data; CRC-checked data; ECC-encoded data; an indicator or identifier of a storage drive, a local storage engine, a NIC, a switch, or a server; formatting information; a frame header; an IP header; a TCP header; a payload; application data; user data; a network packet; metadata; management information; a logical block address (LBA); a physical block address (PBA); an indicator of a region or an allocated region of a volatile memory; a chunk of data; chunk metadata; a logical extent or range of LBAs; a group of data; a predetermined group size; a size of a payload; and a size of multiple payloads stored in a group.

Figure 10:
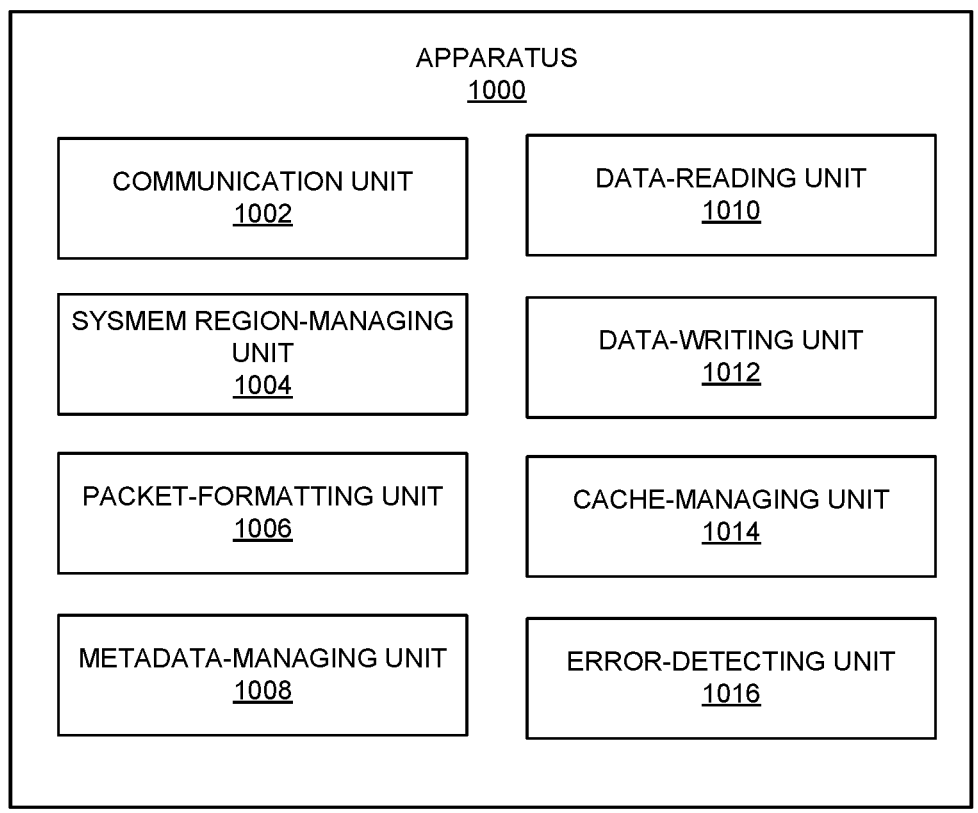
FIG. 10 illustrates an exemplary apparatus that facilitates data movement by bypassing system memory, in accordance with an embodiment of the present application.

FIG. 10 illustrates an exemplary apparatus 1000 that facilitates data movement while bypassing system memory, in accordance with an embodiment of the present application. Apparatus 1000 can comprise a plurality of units or apparatuses which may communicate with one another via a wired, wireless, quantum light, or electrical communication channel. Apparatus 1000 may be realized using one or more integrated circuits, and may include fewer or more units or apparatuses than those shown in FIG. 10. Furthermore, apparatus 1000 may be integrated in a computer system, or realized as a separate device or devices capable of communicating with other computer systems and/or devices.

Apparatus 1000 can comprise modules or units 1002-1016 which are configured to perform functions or operations similar to modules 920-934 of computer system 900 of FIG. 9, including: a communication unit 1002; a sysmem region-managing unit 1004; a packet-formatting unit 1006; a metadata-managing unit 1008; a data-reading unit 1010; a data-writing unit 1012; a cache-managing unit 1014; and an error-detecting unit 1016.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing embodiments described herein have been presented for purposes of illustration and description only. They are not intended to be exhaustive or to limit the embodiments described herein to the forms disclosed. Accordingly, many modifications and variations will be apparent to practitioners skilled in the art. Additionally, the above disclosure is not intended to limit the embodiments described herein. The scope of the embodiments described herein is defined by the appended claims.

What is claimed is:

1. A computer-implemented method, comprising:
allocating, in a volatile memory of a first storage drive, a first region to be accessed directly by a second storage drive,
wherein the first storage drive and the second storage drive are associated with a first server, wherein the first region of the first storage drive is to be further accessed by a third storage drive via a first network interface card (NIC), wherein the first NIC is associated with the first server, and wherein the third storage drive is associated with a second server;
storing data in the first region of the first storage drive;
responsive to receiving a first request from the second storage drive to read the data, transmitting, by the first storage drive to the second storage drive, the data stored in the first region while bypassing a system memory of the first server;
responsive to receiving, from the third storage drive, a second request to read the data, retrieving, by the first NIC, the data stored in the first region while bypassing the system memory of the first server;
sending, by the first NIC to a second NIC associated with the second server, the data as formatted data which includes formatting information and a payload;
sending, by the second NIC to a local storage engine associated with the second server, metadata associated with the data, which causes the local storage engine to:
allocate, by a file system of the local storage engine, a logical extent or a range of logical block addresses (LBAs) based on metadata associated with multiple chunks of data;
send, by the file system to a flash translation layer (FTL) module of the local storage engine, the allocated LBAs;
generate, by the FTL module, physical block addresses (PBAs) mapped to the allocated LBAs, wherein management information includes the PBAs, the metadata, and one or more of an order and a merged size; and
transmit, to the third storage drive, the management information;
receiving, by the third storage drive, the management information from the local storage engine and the payload from the second NIC; and
writing, by the third storage drive, the data to the non-volatile memory of the third storage drive based on the received management information.

2. The method of claim 1, further comprising:
storing, by the first NIC, the data as formatted data which includes formatting information and a payload;
storing, by the second NIC, the formatted data; and
sending, by the second NIC, the payload to the third storage drive.

3. The method of claim 2,
wherein the formatting information includes one or more of a frame header, an Internet Protocol (IP) header, and a Transmission Control Protocol (TCP) header, wherein the payload includes one or more of application data and user data, and wherein sending, by the first NIC to the second NIC, the formatted data further involves sending the formatted data through an Ethernet switch.

4. The method of claim 2, further comprising:

setting, in the second NIC, a second region of a volatile memory of the second NIC as a host memory which is directly accessible by the third storage drive; and storing, by the second NIC, the formatted data in the second region of the second NIC.

5. The method of claim 1, wherein sending, by the second NIC to the local storage engine associated with the second server, the metadata associated with the data further causes the local storage engine to:

generate, by a network engine of the local storage engine, the management information, which includes one or more of the order and the merged size;

group, by a chunk organization module of the local storage engine, multiple chunks of data in parallel;

receive, by the FTL module, the allocated LBAs;

transmit, by the FTL module to a Non-Volatile Memory Express (NVMe) driver, the PBAs and the metadata; and transmit, by the NVMe driver to a controller of the third storage drive, the PBAs and the metadata.

6. The method of claim 1, wherein writing, by the third storage drive, the data to the non-volatile memory based on the received management information comprises:

storing, by the third storage drive, in a buffer of the third storage drive, the payload as part of a group;

storing other payloads in the group, wherein the other payloads are associated with other management information;

determining that a size of the payload and the other payloads meets a predetermined group size; and writing, from the buffer of the third storage drive to the non-volatile memory, the payload and the other payloads of the group.

7. The method of claim 1, wherein writing, by the third storage drive, the data to the non-volatile memory comprises:

receiving, by a controller of the third storage drive, the data, wherein the controller includes a Non-Volatile Memory Express (NVMe) controller, a double data rate (DDR) controller associated with the volatile memory, a cyclic redundancy check (CRC) module, and a flash controller, wherein the flash controller includes an error correction code (ECC) encoding/decoding module;

performing, by the CRC module, a first redundancy check on the received data to obtain CRC data;

storing, by the DDR controller in the first region of the volatile memory, the CRC data;

determining to write the stored CRC data from the first region of the volatile memory to the non-volatile memory;

retrieving, by the DDR controller, the stored CRC data;

performing, by the CRC module, a second redundancy check on the retrieved CRC data to obtain CRC-checked data;

responsive to verifying the CRC-checked data, encoding, by the ECC encoding/decoding module of the flash controller, the CRC-checked data to obtain ECC-encoded data; and writing the ECC-encoded data to the non-volatile memory.

8. The method of claim 1, wherein subsequent to the first storage drive transmitting to the second storage drive the data stored in the first region while bypassing the system memory of the first server, the method further comprises:

retrieving, by the second storage drive, the data stored in the first region while bypassing the system memory of the first server.

9. A computer system, comprising:

a processor; and a memory coupled to the processor and storing instructions which, when executed by the processor, cause the processor to perform a method, the method comprising:

allocating, in a volatile memory of a first storage drive, a first region to be accessed directly by a second storage drive, wherein the first storage drive and the second storage drive are associated with a first server, wherein the first region of the first storage drive is to be further accessed by a third storage drive via a first network interface card (NIC), wherein the first NIC is associated with the first server, and wherein the third storage drive is associated with a second server;

storing data in the first region of the first storage drive;

responsive to receiving a first request from the second storage drive to read the data, transmitting, by the first storage drive to the second storage drive, the data stored in the first region while bypassing a system memory of the first server;

responsive to receiving, from the third storage drive, a second request to read the data, retrieving, by the first NIC, the data stored in the first region while bypassing the system memory of the first server;

sending, by the first NIC to a second NIC associated with the second server, the data as formatted data which includes formatting information and a payload;

sending, by the second NIC to a local storage engine associated with the second server, metadata associated with the data, which causes the local storage engine to:

allocate, by a file system of the local storage engine, a logical extent or a range of logical block addresses (LBAs) based on metadata associated with multiple chunks of data;

send, by the file system to a flash translation layer (FTL) module of the local storage engine, the allocated LBAs;

generate, by the FTL module, physical block addresses (PBAs) mapped to the allocated LBAs, wherein management information includes the PBAs, the metadata, and one or more of an order and a merged size; and transmit, to the third storage drive, the management information;

receiving, by the third storage drive, the management information from the local storage engine and the payload from the second NIC; and writing, by the third storage drive, the data to the non-volatile memory of the third storage drive based on the received management information.

10. The computer system of claim 9, wherein the method further comprises:

storing, by the first NIC, the data as formatted data which includes formatting information and a payload;

storing, by the second NIC, the formatted data;

sending, by the second NIC, the payload to the third storage drive.

11. The computer system of claim 10,
wherein the formatting information includes one or more of a frame header, an Internet Protocol (IP) header, and a Transmission Control Protocol (TCP) header,
wherein the payload includes one or more of application data and user data, and
wherein sending, by the first NIC to the second NIC, the formatted data further involves sending the formatted data through an Ethernet switch.

12. The computer system of claim 10, wherein the method further comprises:
setting, in the second NIC, a second region of a volatile memory of the second NIC as a host memory which is directly accessible by the third storage drive; and
storing, by the second NIC, the formatted data in the second region of the second NIC.

13. The computer system of claim 9, wherein sending, by the second NIC to the local storage engine associated with the second server, the metadata associated with the data further causes the local storage engine:
generate, by a network engine of the local storage engine, the management information, which includes one or more of the order and the merged size;
group, by a chunk organization module of the local storage engine, multiple chunks of data in parallel;
receive, by the FTL module, the allocated LBAs;
transmit, by the FTL module to a Non-Volatile Memory Express (NVMe) driver, the PBAs and the metadata; and
transmit, by the NVMe driver to a controller of the third storage drive, the PBAs and the metadata.

14. The computer system of claim 9, wherein writing, by the third storage drive, the data to the non-volatile memory based on the received management information comprises:
storing, by the third storage drive, in a buffer of the third storage drive, the payload as part of a group;
storing other payloads in the group, wherein the other payloads are associated with other management information;
determining that a size of the payload and the other payloads meets a predetermined group size; and
writing, from the buffer of the third storage drive to the non-volatile memory, the payload and the other payloads of the group.

15. The computer system of claim 9, wherein writing, by the third storage drive, the data to the non-volatile memory comprises:
receiving, by a controller of the third storage drive, the data,
wherein the controller includes a Non-Volatile Memory Express (NVMe) controller, a double data rate (DDR) controller associated with the volatile memory, a cyclic redundancy check (CRC) module, and a flash controller, wherein the flash controller includes an error correction code (ECC) encoding/decoding module;
performing, by the CRC module, a first redundancy check on the received data to obtain CRC data;
storing, by the DDR controller in the first region of the volatile memory, the CRC data;
determining to write the stored CRC data from the first region of the volatile memory to the non-volatile memory;
retrieving, by the DDR controller, the stored CRC data;
performing, by the CRC module, a second redundancy check on the retrieved CRC data to obtain CRC-checked data;
responsive to verifying the CRC-checked data, encoding, by the ECC encoding/decoding module of the flash controller, the CRC-checked data to obtain ECC-encoded data; and
writing the ECC-encoded data to the non-volatile memory.

16. An apparatus, comprising:
a region-managing module configured to allocate, in a volatile memory of a first storage drive, a first region to be accessed directly by a second storage drive or a first network interface card (NIC),
wherein the first storage drive, the second storage drive, and the first NIC are associated with a first server,
wherein the first region of the first storage drive is to be further accessed by a third storage drive via a first network interface card (NIC), wherein the first NIC is associated with the first server, and wherein the third storage drive is associated with a second server;
a data-writing module configured to store data in the first region of the first storage drive;
a communication module configured receive a first request from the second storage drive to read the data,
wherein the data-writing module is configured to, responsive to the communication module receiving the first request, transmit, by the first storage drive to the second storage drive, the data stored in the first region while bypassing a system memory of the first server,
wherein the communication module is further configured to receive, from the third storage drive, a second request to read the data; and
a data-reading module configured to, responsive to the communication module receiving the second request, retrieve, by the first NIC, the data stored in the first region while bypassing the system memory of the first server,
wherein the communication module is further configured to:
send, by the first NIC to a second NIC associated with the second server, the data as formatted data which includes formatting information and a payload; and
send, by the second NIC to a local storage engine associated with the second server, metadata associated with the data,
wherein a metadata-managing unit is configured to, responsive to the second NIC sending the metadata to the local storage engine:
allocate, by a file system of the local storage engine, a logical extent or a range of logical block addresses (LBAs) based on metadata associated with multiple chunks of data;
send, by the file system to a flash translation layer (FTL) module of the local storage engine, the allocated LBAs;
generate, by the FTL module, physical block addresses (PBAs) mapped to the allocated LBAs, wherein management information includes the PBAs, the metadata, and one or more of an order and a merged size; and
transmit, to the third storage drive, the management information;
wherein the communication module is further configured to receive, by the third storage drive, the management information from the local storage engine and the payload from the second NIC, and
wherein the data-writing module is further configured to write, by the third storage drive, the data to the non-volatile memory of the third storage drive based on the received management information.

\* \* \* \* \*